(12) United States Patent
Masuda et al.

(10) Patent No.: US 6,433,421 B2
(45) Date of Patent: Aug. 13, 2002

(54) SEMICONDUCTOR DEVICE

(75) Inventors: Masachika Masuda, Tokorozawa; Tamaki Wada, Higashimurayama; Hirotaka Nishizawa, Fuchu; Koich Iro Kagaya, Higashimurayama, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/826,965

(22) Filed: Apr. 6, 2001

(30) Foreign Application Priority Data

Apr. 14, 2000 (JP) ........................................ 2000-114352

(51) Int. Cl.$^7$ ............................................... H01L 23/34
(52) U.S. Cl. ...................... 257/723; 257/666; 257/777; 257/686
(58) Field of Search ................................ 257/723, 666, 257/686, 777; 438/107

(56) References Cited

U.S. PATENT DOCUMENTS

| | | | | |
|---|---|---|---|---|
| 5,479,051 A | * | 12/1995 | Waki et al. | 257/723 |
| 6,091,144 A | * | 7/2000 | Harada | 257/723 |
| 6,118,184 A | * | 9/2000 | Ishio et al. | 257/666 |
| 6,316,838 B1 | * | 11/2001 | Ozawa et al. | 257/723 |

FOREIGN PATENT DOCUMENTS

| | | |
|---|---|---|
| JP | 4-302165 | 10/1992 |
| JP | 7-58281 | 3/1995 |

* cited by examiner

*Primary Examiner*—Hoai V. Ho
*Assistant Examiner*—Andy Huynh
(74) *Attorney, Agent, or Firm*—Mattingly, Stanger & Malur, P.C.

(57) ABSTRACT

A semiconductor device comprising: a resin sealing body, plural semiconductor chips situated inside the resin sealing body and formed of rectangular-shaped plane surfaces, having a first main surface and second main surface facing each other, and having electrodes disposed on the first side of a first side and a second side of the first main surface, the first side and second side facing each other, and leads having inner parts situated inside the resin sealing body and outer parts situated outside the resin sealing body, the inner parts being electrically connected to the electrodes of the plural semiconductor chips via bonding wires, wherein: the first main surfaces are aligned in the same direction with their respective first sides situated on the same side, and the plural semiconductor chips are laminated in positions offset with respect to one another such that the electrodes of one of the mutually opposite semiconductor chips are situated further outside than the first sides of the other semiconductor chips.

5 Claims, 29 Drawing Sheets

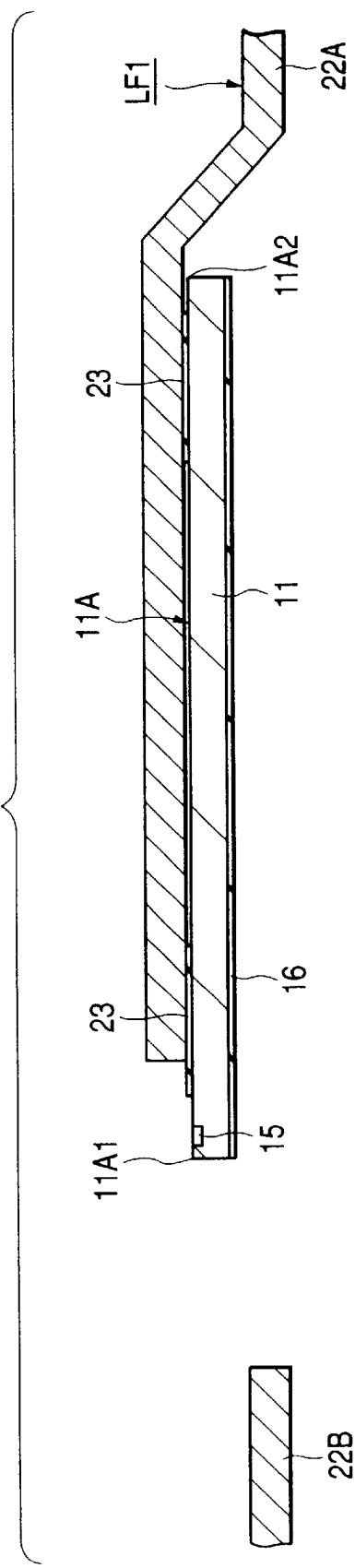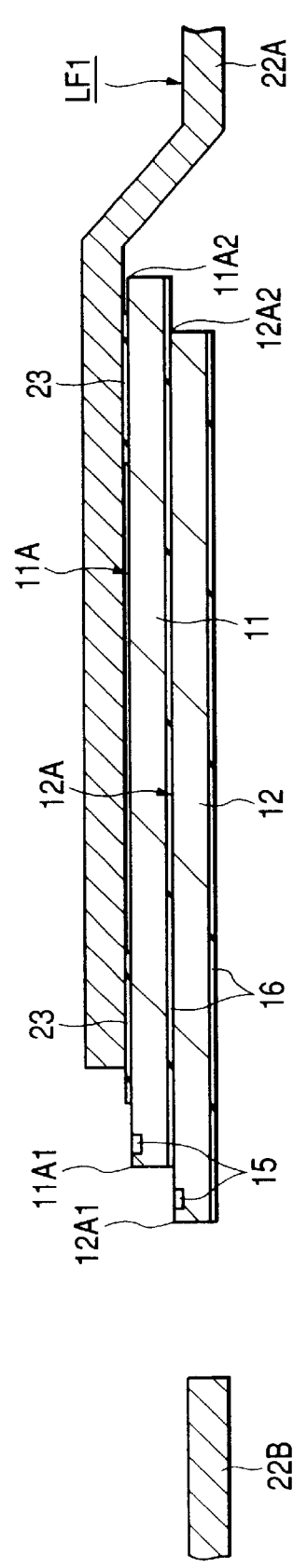

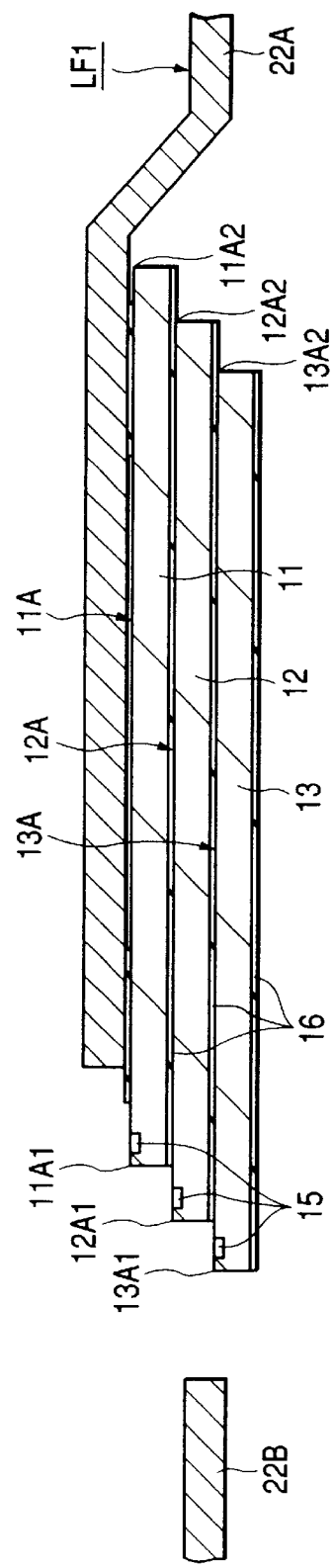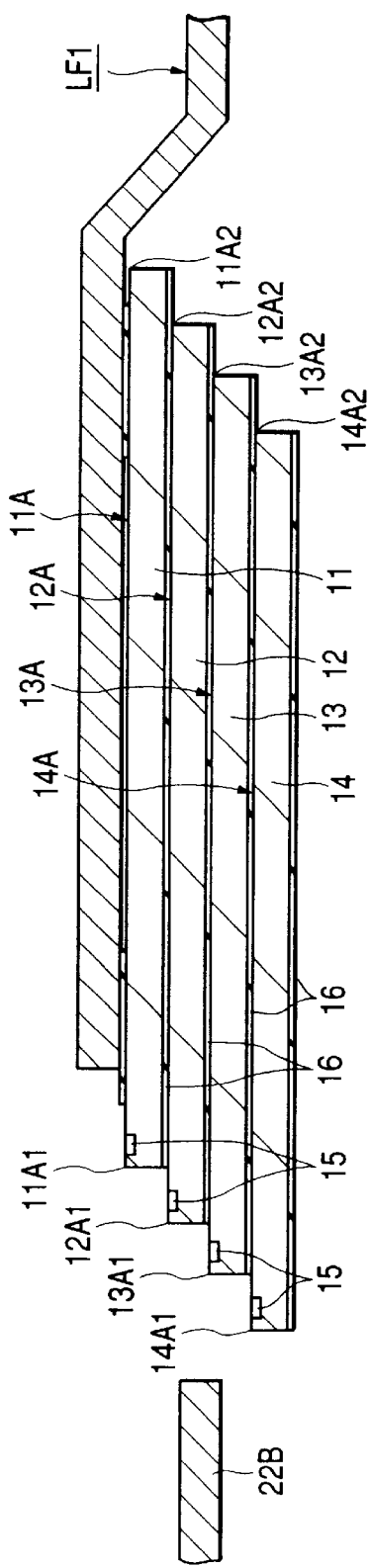

SEMICONDUCTOR DEVICE

BACKGROUND OF THE INVENTION

This invention relates to a semiconductor device and a method of manufacturing the same, and in particular to a semiconductor device comprising plural semiconductor chips laminated in a resin sealing body and a method of manufacturing the same.

One method of increasing the capacity of memory circuits is known wherein two semiconductor chips housing memory circuits are laminated together, and the two semiconductor chips are sealed in a resin sealing body to form a stacked type semiconductor device. Various structures have been proposed for this stacked type semiconductor device, and marketed. For example, in Japanese Published Unexamined Patent Publication No. Hei 7(1995)-58281, an LOC (Lead On Chip) stacked type semiconductor device is disclosed. In Japanese Published Unexamined Patent Publication No. Hei 4(1992)-302165, a tub structured stacked type semiconductor device is disclosed.

A LOC stacked type semiconductor device has a structure essentially comprising a first semiconductor chip and a second semiconductor chip wherein plural electrodes are formed on a circuit-forming surface which is the front surface (a main surface) of a front and rear surface (a main surface and another main surface opposite each other), plural first leads adhesion-fixed to the circuit-forming surface of the first semiconductor chip with the interposition of an insulating film and electrically connected to the electrodes of this circuit-forming surface via bonding wires, plural second leads adhesion-fixed to the circuit-forming surface of the second semiconductor chip with the interposition of an insulating film and electrically connected to the electrode of this circuit-forming surface via bonding wires, and a resin sealing body which seals the first semiconductor chip, second semiconductor chip, inner parts of the first leads, inner parts of the second leads and bonding wires. The first semiconductor chip and second semiconductor chip are laminated with their circuit-forming surfaces facing each other. The first leads and second leads are joined with their connecting parts mutually superimposed.

A tub structured stacked type semiconductor device comprises a first semiconductor chip fixed to the front surface (a main surface) of a front and rear surface (a main surface and another main surface opposite each other) of a tub (known also as a die pad) via an adhesive layer, a second semiconductor chip fixed to the rear surface of the tub (other main surface) via an adhesive layer, plural exclusive leads electrically connected to electrodes of one of the first semiconductor chip and second semiconductor chip via bonding wires, plural common leads electrically connected to the electrodes of the first semiconductor chip and second semiconductor chip via bonding wires, and a resin sealing body which seals the first semiconductor chip, second semiconductor chip, inner parts of the exclusive leads, inner parts of the common leads and the bonding wires. The electrodes of the first semiconductor chip and second semiconductor chip are arranged in rows along the opposite long sides of the circuit-forming surface. The exclusive leads and common leads are respectively disposed outside the two long sides of the semiconductor chip.

SUMMARY OF THE INVENTION

The inventors, as a result of examining the aforesaid stacked type semiconductor devices, identified the following problems.

(1) In LOC stacked type semiconductor devices, the first leads which are electrically connected to the electrodes of the first semiconductor chip via bonding wires and the second leads which are electrically connected to the electrodes of the second semiconductor chip via bonding wires, are joined to each other partially superimposed. In the case of such a construction, the device must be manufactured using two lead frames, so manufacturing costs increased.

(2) In LOC stacked type semiconductor devices, after electrically connecting the electrodes and leads of the semiconductor chips via bonding wires, the two semiconductor chips are laminated by superimposing the two lead frames. In this case, the bonding wires easily tend to deform when the semiconductor chips are laminated, and this led to a decrease of yield.

(3) In tub structured stacked type semiconductor devices, the semiconductor chips are mounted on the front and rear surfaces of the tub. In such a construction, as it is difficult to bring the tub into contact with a heat stage after mounting the semiconductor chips on the front and rear surfaces of the tub, it is difficult to heat the semiconductor chip to the temperature required for wire bonding. Therefore, bad contacts easily occur between the electrodes of the semiconductor chip and bonding wires, and this leads to a decrease of yield.

(4) In a tub structured type semiconductor device, the lead frames must be inverted after electrically connecting the electrodes of the semiconductor chip mounted on the front surface of the tub with the leads, and before electrically connecting the electrodes of the semiiconductor chip mounted on the rear surface of the tub with the leads. This leads to a decrease of productivity.

The bonding wires also easily deform when the lead frames are inverted, and this led to a decrease of yield.

It is therefore an object of this invention to provide a technique for manufacturing a semiconductor device wherein plural semiconductor chips are laminated and these plural semiconductor chips are sealed in a resin sealing body, which permits cost reduction.

It is another object of this invention to provide a technique for manufacturing a semiconductor device wherein plural semiconductor chips are laminated and these plural semiconductor chips are sealed in aresin sealing body, which achieves higher yield.

It is another object of this invention to provide a technique for manufacturing the a semiconductor device wherein plural semiconductor chips are laminated and these plural semiconductor chips are sealed in a resin sealing body, which achieves higher production.

These and other objects and features of this invention will become apparent from the following description and drawings appended thereto.

The representative features of the Invention described in this Application may be simply summarized as follows.

(1) A semiconductor device comprising:
   a resin sealing body,
   plural semiconductor chips situated inside the resin sealing body and formed of rectangular-shaped plane surfaces, having a first main surface and second main surface facing each other, and having electrodes disposed on the first side of a first side and a second side of the first main surface, the first side and second side facing each other, and
   leads having inner parts situated inside the resin sealing body and outer parts situated outside the resin sealing body, the leads being electrically connected to electrodes of the plural semiconductor chips via bonding wires, wherein:

the respective first main surfaces of the plural semiconductor chips are aligned in the same direction such that their respective first sides are situated on the same side, and the plural semiconductor chips are laminated in positions offset with respect to one another such that the electrodes of one of the mutually opposite semiconductor chips are situated further outside than the first side of the other semiconductor chip.

(2) A semiconductor device as defined in the aforesaid (1), wherein:

the plural semiconductor chips are laminated in positions offset with respect to one another such that the second side of one of the mutually opposite semiconductor chips is situated further inside than the second side of the other semiconductor chip.

(3) A semiconductor device comprising:

a resin sealing body having a rectangular plane surface, first and second semiconductor chips situated inside the resin sealing body and formed of rectangular-shaped plane surfaces, having a first main surface and second main surface facing each other, and having electrodes disposed on the first side of a first side and a second side of the first main surface, the first side and second side facing each other, first leads having inner parts situated inside the resin sealing body, and outer parts projecting from the first side of the mutually opposite first side and second side of the resin sealing body situated outside the resin sealing body, the inner parts being electrically connected to the electrodes of the first semiconductor chip via bonding wires, and second leads having inner parts situated inside the resin sealing body, and outer parts projecting from the second side of the resin sealing body situated outside the resin sealing body, the inner parts being electrically connected to the electrodes of the second semiconductor chip via bonding wires, wherein:

the second main surface of the first semiconductor chip and the first main surface of the second semiconductor chip are aligned facing each other with their respective first sides situated on the side of the second leads, and the first and second semiconductor chips are laminated in positions offset with respect to one another such that the electrodes of the second semiconductor chip are situated further outside than the first side of the first semiconductor chip, and the second side of the first semiconductor chip is situated further outside than the second side of the second semiconductor chip, and the inner parts of the first leads are adhesion-fixed to the first main surface of the first semiconductor chip.

(4) A semiconductor device as defined in the aforesaid (3), wherein:

the ends of the inner parts of the first leads are disposed in the vicinity of the electrodes of the first semiconductor chip.

(5) A method of manufacturing a semiconductor device comprising a first and second semiconductor chip formed of rectangular-shaped plane surfaces and having a mutually opposite first main surface and second main surface, comprising the steps of:

preparing the first and second semiconductor chip in which electrodes are disposed on one side of a first side and a second side of the first main surface, the sides facing each other, and preparing a lead frame comprising first leads and second leads having inner parts and outer parts, the ends of these inner parts facing each other, adhesion-fixing the first semiconductor chip to the inner parts of the first leads with the first main surface of the first semiconductor chip and inner parts of the leads facing each other such that the first side of the first semiconductor chip is situated on the side of the second leads, aligning the second main surface of the first semiconductor chip and first main surface of the second semiconductor chip such that the first side of the second semiconductor chip is situated on the side of the second leads, and adhesion-fixing the first semiconductor chip and second semiconductor chip in positions offset with respect to one another such that the electrodes of the second semiconductor chip are situated further outside than the first side of the first semiconductor chip, and electrically connecting the electrodes of the first semiconductor chip to the inner parts of the first leads via bonding wires, and electrically connecting the electrodes of the second semiconductor chip to the inner parts of the second leads via bonding wires.

BRIEF DESCRIPTION OF THE DRAWINGS

FIG. 5 is a schematic plan view describing the manufacture of the semiconductor device according to the first embodiment of this invention.

FIG. 6 is a schematic cross-sectional view describing the manufacture of the semiconductor device according to the first embodiment of this invention.

DESCRIPTION OF THE PREFERRED EMBODIMENTS

Hereafter, this invention will be described in detail referring to the appended drawings. In all drawings used to describe the embodiments of the invention, identical symbols are assigned to identical functions, and their description is not repeated.
(Embodiment 1)

In this embodiment, the case will be described where this invention is applied to a TSOP (Thin Small Outline Package) semiconductor device which is a bidirectional lead array structure.

Figure 1:
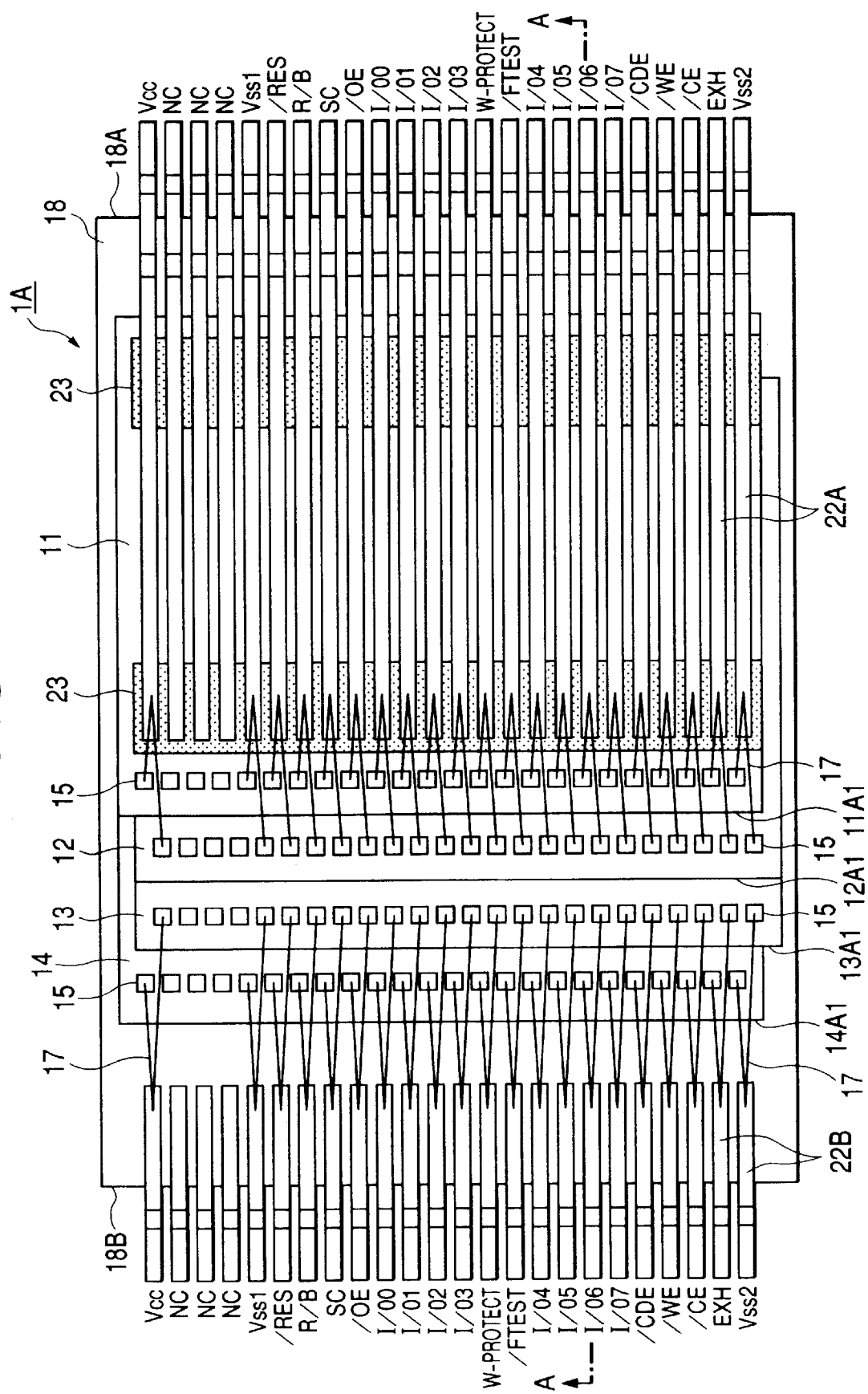
FIG. 1 is a schematic plan view showing a semiconductor device which is a first embodiment of this invention with the upper part of a resin sealing body removed.
Figure 2:
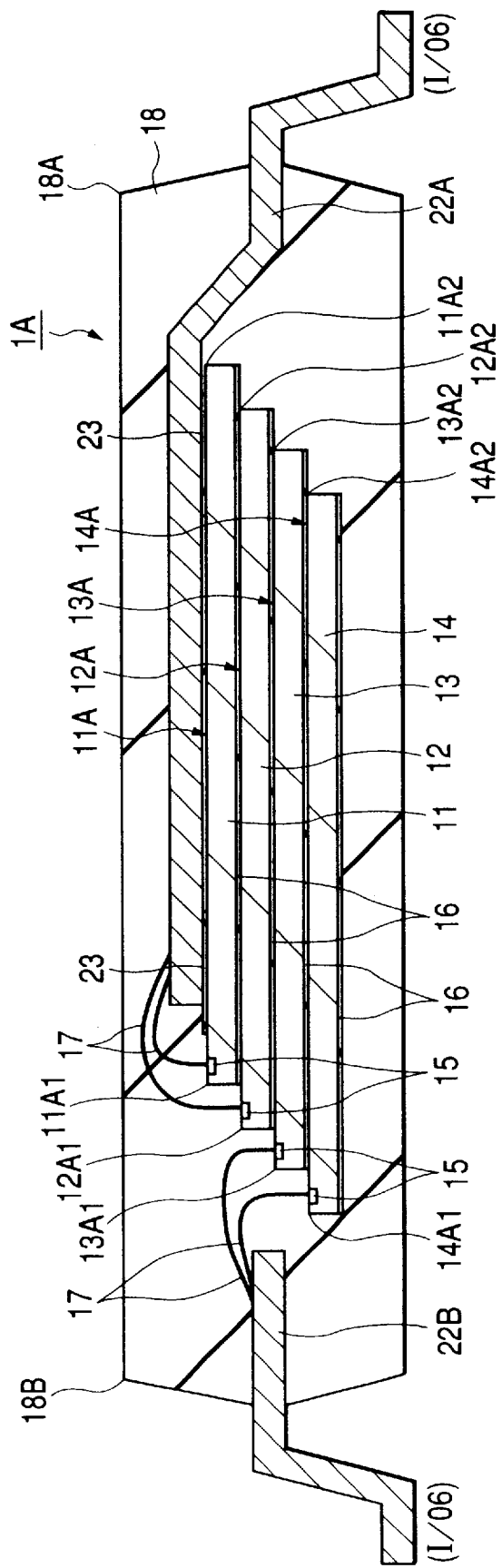
FIG. 2 is a schematic sectional view along a line A—A in FIG. 1.
Figure 3:
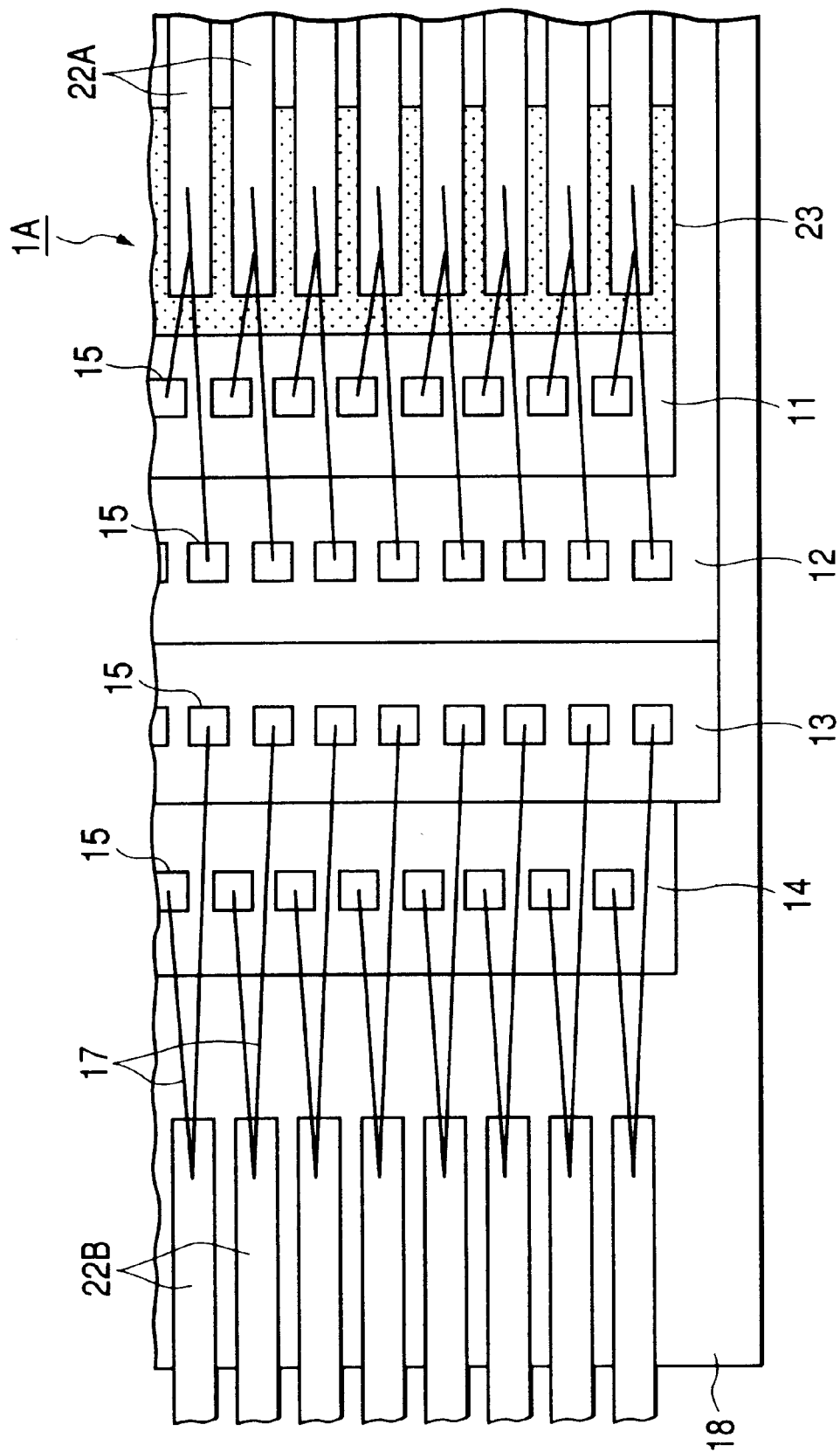
FIG. 3 is a schematic plan view showing an enlargement of part of FIG. 1.

FIG. 1 is a schematic plan view showing the semiconductor device, which is the first embodiment of this invention, with the upper part of the resin sealing body removed, FIG. 2 is a schematic cross-sectional view along a line A—A in FIG. 1, and FIG. 3 is a schematic plan view showing an enlargement of part of FIG. 1.

As shown in FIG. 1 and FIG. 2, a semiconductor device 1 according to this embodiment comprises four semiconductor chips (11, 12, 13, 14) laminated over each other, these four semiconductor chips (hereafter referred to simply as chips) being sealed in one resin sealing body 18. The four chips (11, 12, 13, 14) are laminated so that their circuit-forming surfaces (one main surface of a main surface and another main surface facing each other) 11A, 12A, 13A, 14A are oriented in the same direction.

The four chips (11, 12, 13, 14) are formed with identical external dimensions. Further, the four chips (11, 12, 13, 14) are formed such that their plane surfaces are respectively rectangular, and in this embodiment they are oblong, for example.

The four chips (11, 12, 13, 14) may for example comprise a semiconductor substrate comprising for example single crystal silicon, and a multilayer interconnection formed upon this semiconductor substrate. These four chips (11, 12, 13, 14) each comprise for example a 256 MB EEPROM (Electrically Erasable Programmable Read-Only Memory), known as a flash memory, as a memory circuit.

In the four chips (11, 12, 13, 14), plural electrodes (bonding pads) 15 are formed along one of the long sides (11A1, 12A1, 13A1, 14A1) of the two mutually opposite long sides of the circuit-forming surfaces (11A, 12A, 13A, 14A) . These plural electrodes 15 are each formed upon the uppermost layer of the multilayer interconnection of the chips (11, 12, 13, 14). The uppermost interconnection layer is covered by a surface protection film (final protection film) formed over it, and bonding apertures which expose the surfaces of the electrodes 15 are formed in this surface protection layer.

Flash memory circuit patterns built into the four chips (11, 12,13, 14) comprise identical circuit patterns. Also, the layout patterns of the electrodes 15 formed on the circuit-forming surfaces (11A, 12A, 13A, 14A) comprise identical patterns. In other words, the four chips (11, 12,13, 14) each have an identical structure.

The plane surface of the resin sealing body 18 is formed in a rectangular shape, and in this embodiment it is oblong, for example. Plural leads 22A are arranged in rows along one of the short sides of two mutually opposite short sides (18A, 18B) of this resin sealing body 18, plural leads 22B being arranged in rows along the other short side 18B.

The plural leads 22A each comprise an inner part situated inside the resin sealing body 18, and an outer part projecting from one of the short sides 18A of the resin sealing body 18 and situated outside the resin sealing body 18. The plural leads 22B each comprise an inner part situated inside the resin sealing body 18, and an outer part projecting from the other short side 18B of the resin sealing body 18 and situated outside the resin sealing body 18. The outer parts of each of the plural leads 22A, and the plural leads 22B, are bent in a gull wing shape which is a surface-mounted lead shape. Specifically, a semiconductor device 1A of this embodiment is a TSOP Type I wherein leads are arranged in rows on the two mutually opposite short sides of the resin sealing body 18.

The inner parts of each of the plural leads 22A are respectively electrically connected to the electrodes 15 of the chip 11 via bonding wires 17, and respectively electrically connected to the electrodes 15 of the chip 12 via the bonding wires 17. The inner parts of each of the plural leads 22B are respectively electrically connected to the electrodes 15 of the chip 13 via the bonding wires 17, and respectively electrically connected to the electrodes 15 of the chip 14 via the bonding wires 17.

Terminal names are given to each of the plural leads 22A, 22B. Vcc is a power supply potential terminal fixed at the potential of the power supply (e.g., 5V). Vss1 and Vss2 are reference potential terminals fixed at a reference potential (e.g., 0V). I/O0–I/O7 are data input/output terminals. RES is a reset terminal. R/B is a ready/busy terminal. CDE is a command data enable terminal. OE is an output enable terminal. SC is a serial clock terminal. WE is a write enable terminal. CE is a chip enable terminal. W-PROTECT is a write protect terminal. FTEST is a function test terminal. NC is an empty terminal.

The rear surface (the other main surface of the two mutually opposite main surfaces) of the chip 11 and the circuit-forming surface 12A of the chip 12 are aligned facing each other such that one of their long sides (11A1, 12A1) is situated on the side of the leads 22B. The chip 11 and chip 12 are adhesion-fixed and offset with respect to one another such that the electrodes 15 of the chip 12 are situated further outside than the long side 11A1 of the chip 11, and the other long side 11A2 of the chip 11 is situated further outside than the other long side 12A2 of the chip 12 (offset such that the long side 11A1 of the chip 11 and the other long side 12A2 of the chip 12 approach each other). The chip 11 and chip 12 are adhesion-fixed by an adhesive layer 16 interposed between them.

The rear surface (other main surface) of the chip 12 and the circuit-forming surface 13A of the chip 13 are aligned facing each other such that one of their long sides (12A1, 13A1) is situated on the side of the leads 22B. The chip 11 and chip 12 are adhesion-fixed and offset with respect to one another such that the electrodes 15 of the chip 13 are situated further outside than the long side 12A1 of the chip 12, and the other long side 12A2 of the chip 12 is situated further outside than the other long side 13A2 of the chip 13 (offset such that the long side 12A1 of the chip 12 and the other long side 13A2 of the chip 13 approach each other). The chip 12 and chip 13 are adhesion-fixed by the adhesive layer 16 interposed between them.

The rear surface (other main surface) of the chip 13 and the circuit-forming surface 14A of the chip 14 are aligned facing each other such that one of their long sides (13A1, 14A1) is situated on the side of the leads 22B. The chip 13 and chip 14 are adhesion-fixed and offset with respect to one another such that the electrodes 15 of the chip 14 are situated further outside than the long side 13A1 of the chip 13, and the other long side 13A2 of the chip 13 is situated further outside than the other long side 14A2 of the chip 14 (offset such that the long side 13A1 of the chip 13 and the other long side 14A2 of the chip 14 approach each other). The chip 13 and chip 14 are adhesion-fixed by the adhesive layer 16 interposed between them.

In other words, the circuit-forming surfaces (11A, 12A, 13A, 14A) are aligned in the same direction such that one of their long sides (11A1, 12A1, 13A1, 14A1) is situated on the side of the leads 22B, and the four chips (11, 12, 13, 14) are laminated with their positions offset with respect to one another such that the electrodes of one of the chips, which are mutually facing each other, are situated further outside than one of the long sides of the other chip.

The inner parts of the leads 22A are adhesion-fixed to the circuit-forming surface 11A of the chip 11 situated in the upper level of the four laminated chips via an adhesive layer 23. The inner parts of the leads 22A are disposed such that their ends are in the vicinity of the electrodes 15 of the chip 11. The inner parts of the leads 22A are longer than the inner parts of the leads 22B.

The bonding wires 17 may for example be gold (Au) wires. The bonding wires 17 may be connected by, for example, ball bonding using ultrasonic vibration together with thermocompression bonding.

The resin sealing body 18 may, in order to achieve lower stress, be comprised of for example a biphenolic resin to which a phenolic curing agent, silicone rubber and a filler are added. This resin sealing body 18 is formed by transfer molding, which is suitable for mass production. In transfer molding, the resin sealing body is formed using a mold provided with a pot, runner, flow gate and cavity, resin being pressure-injected from the pot into the cavity via the runner and flow gate.

In this embodiment, the thickness of each of the four chips is approximately 0.1 mm, the thickness of the adhesive layers 16, 23 is approximately 0.025 mm, the thickness of the leads 22A, 22B is approximately 0.125 mm, the thickness of the resin from the upper surface of the resin sealing body 18 to the leads 22A on the chip 1 is approximately 0.1 mm, the thickness of the resin from the lower surface of the resin sealing body 18 to the adhesive layer 16 on the rear surface of the chip 40 is approximately 0.25 mm, and the height from the upper surface of the resin sealing body 18 to the mounting surfaces of the leads (22A, 22B) is approximately 1.2 mm.

As shown in FIG. 3, the chip 11 and chip 12 are adhesion-fixed with their positions offset with respect to one another so that the spaces between the electrodes 15 of the chip 11 are opposite the electrodes 15 of the chip 12. The chip 13 and chip 14 are adhesion-fixed with their positions offset with respect to one another so that the spaces between the electrodes 15 of the chip 14 are opposite the electrodes 15 of the chip 13.

Figure 4:
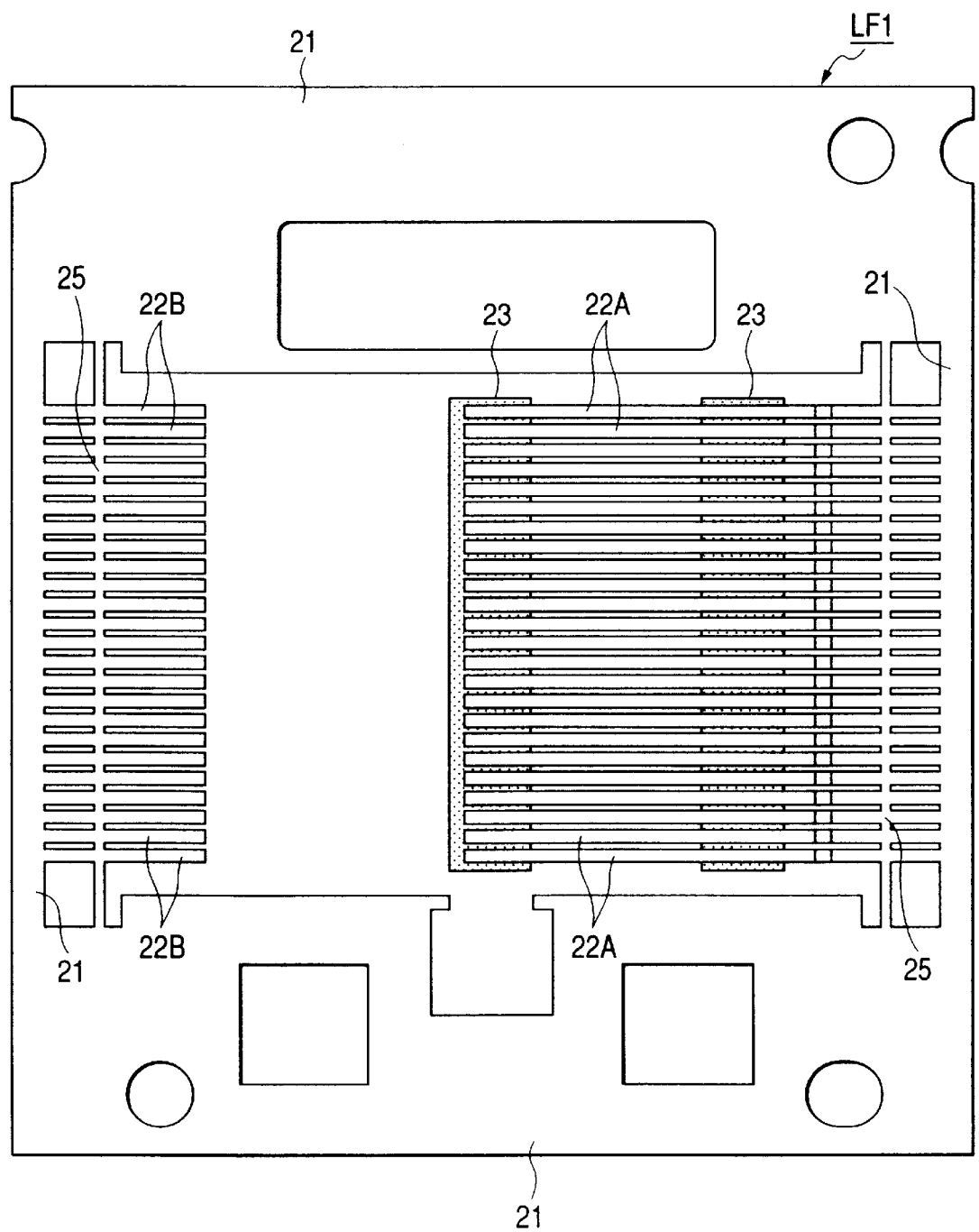
FIG. 4 is a schematic plan view of a lead frame used in a process for manufacturing the semiconductor device according to a first embodiment of this invention.

Next, a lead frame used for manufacturing the semiconductor device 1A will be described referring to FIG. 4. FIG. 4 is a schematic plan view of the lead frame. A real lead frame has a multiple string structure so that plural semiconductor devices can be manufactured, but to simplify the drawing, one lead frame whereby one semiconductor device is manufactured, is shown.

As shown in FIG. 4, a lead frame LF1 comprises a set of leads comprising the plural leads 22A, a set of leads comprising the plural leads 22B and the adhesive layer 23 enclosed in the region defined by a frame body 21. The plural leads 22A are arranged in rows along one of the two mutually opposite short side parts of the frame body 21, and are formed in one piece with this short side part. The plural leads 22B are arranged in rows along the other of the two mutually opposite short side parts of the frame body 21, and are formed in one piece with this other short side part. In other words, the lead frame LF1 has a bidirectional lead array structure.

The plural leads 22A each have an inner part sealed by the resin sealing body and an outer part which is led outside the resin sealing body, and are interconnected via a tie bar (dam bar) 25. The plural leads 22B each have an inner part sealed by the resin sealing body and an outer part which is led outside the resin sealing body, and are interconnected via the tie bar (dam bar) 25.

The lead frame LF1 is formed by forming a predetermined lead pattern by etching or pressing a substrate material comprising, for example, an iron (Fe)-nickel (Ni) alloy, copper (Cu) or a copper alloy.

Figure 7:
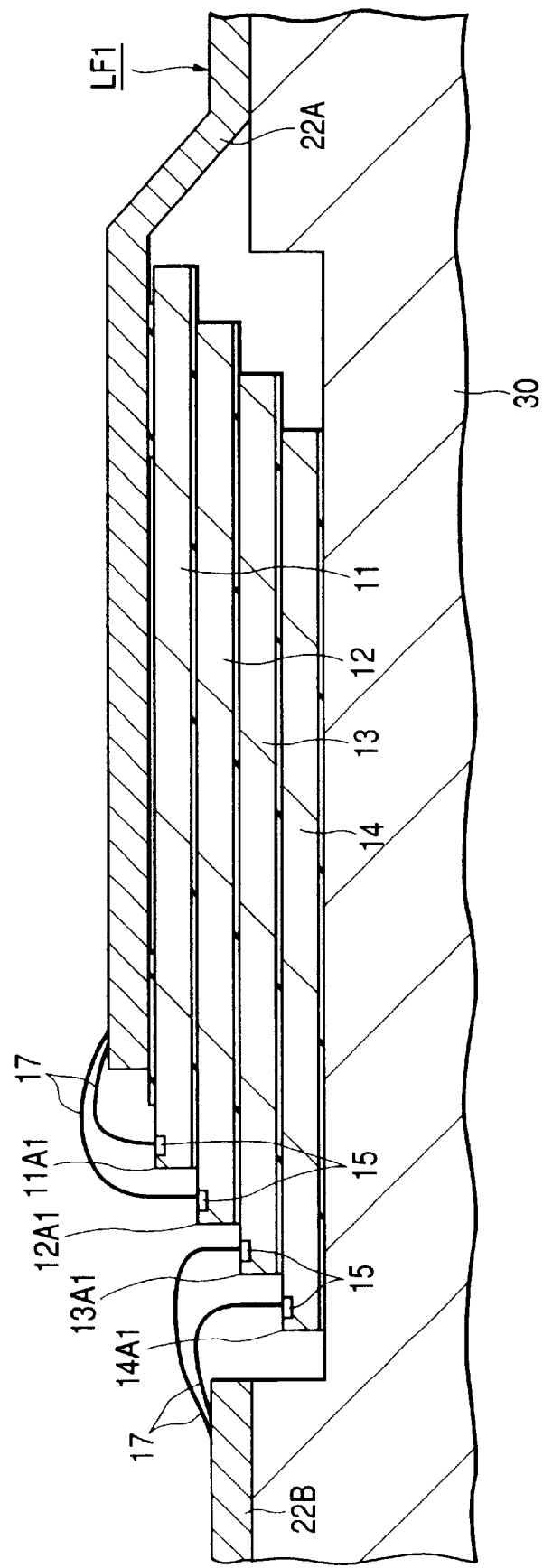
FIG. 7 is a schematic cross-sectional view describing the manufacture of the semiconductor device according to the first embodiment of this invention.

Next, the method of manufacturing the substrate 1A will be described referring to FIG. 5–FIG. 7 (schematic cross-sectional views).

First, the chip 11 is adhesion-fixed to the lead frame LF1. The lead frame LF1 is fixed to the semiconductor chip 11 by fixing the inner parts of the leads 22A to the circuit-forming surface 11A via the adhesive film 23, as shown in FIG. 5(a). In this step, the chip 11 is arranged such that one of the long sides 11A1 of the chip 11 is situated on the side of the leads 22B (on the side of the other set of leads of the two mutually opposite sets of leads).

Next, the chip 12 is adhesion-fixed to the chip 11. The chip 11 is fixed to the chip 12 by fixing the circuit-forming surface 12A of the chip 12 to the rear surface of the chip 11 via the adhesive film 16, as shown in FIG. 5(b). In this step, the chip 12 is arranged such that one of the long sides 12A1 of the chip 12 is situated on the side of the leads 22B. The positions of the chips are respectively offset with respect to one another such that the electrodes 15 of the chip 12 are situated further outside than the long side 11A1 of the chip 11, and the other long side 11A2 of the chip 11 is situated further outside than the other long side 12A2 of the chip 12. The positions are offset with respect to one another also so that the spaces between the electrodes 15 of the chip 11 are opposite the electrodes 15 of the chip 12.

Next, the chip 13 is adhesion-fixed to the chip 12. The chip 11 is fixed to the chip 12 by fixing the circuit-forming surface 13A of the chip 13 to the rear surface of the chip 12 via the adhesive film 16, as shown in FIG. 6(c). In this step, the chip 13 is arranged such that one of the long sides 13A1 of the chip 13 is situated on the side of the leads 22B. The positions of the chips are respectively offset with respect to one another such that the electrodes 15 of the chip 13 are situated further outside than the long side 12A1 of the chip 12, and the other long side 12A2 of the chip 12 is situated further outside than the other long side 13A2 of the chip 13.

Next, the chip 14 is adhesion-fixed to the chip 13. The chip 13 is fixed to the chip 14 by fixing the circuit-forming surface 14A of the chip 14 to the rear surface of the chip 13 via the adhesive film 16, as shown in FIG. 6(d). In this step, the chip 14 is arranged such that one of the long sides 14A1 of the chip 14 is situated on the side of the leads 22B. The positions of the chips are respectively offset with respect to one another such that the electrodes 15 of the chip 14 are situated further outside than the long side 13A1 of the chip 13, and the other long side 13A2 of the chip 13 is situated further outside than the other long side 14A2 of the chip 14. The positions are offset with respect to one another also so that the spaces between the electrodes 15 of the chip 14 are opposite the electrodes 15 of the chip 13. By this process, the circuit-forming surfaces (11A, 12A, 13A, 14A) are aligned in the same direction with one of their short sides (11A1, 12A1, 13A1, 14A1) situated on the side of the leads 22B, and the four chips (11, 12, 13, 14) are respectively laminated so that the electrodes of one of the mutually opposite chips are situated further outside than one of the short sides of the other chip.

Next, the electrodes 15 of the chip 11 and chip 12 are electrically connected to the inner parts of the leads 22A by the bonding wires 17, and the electrodes 15 of the chip 13 and chip 14 are electrically connected to the inner parts of the leads 22B by the bonding wires 17. Connections by these bonding wires 17 are made by inserting the lead frame LF1 into a heat stage 30 with the heat stage 30 facing the rear surface of the chip 14 situated in the lowermost level, as shown in FIG. 7. In this embodiment, the adhesive layer 16 is provided on the rear surface of the chip 14, so the chip 14 is mounted on the heat stage 30 with the interposition of the adhesive layer 16.

In this process, the circuit-forming surfaces (11A, 12A, 13A, 14A) are aligned in the same direction with one of their short sides (11A1, 12A1, 13A1, 14A1) situated on the side of the leads 22B, and the four chips (11, 12, 13, 14) are laminated so that the electrodes of one of the mutually opposite chips are situated further outside than one the long sides of the other chip. Hence, the electrodes of the four chips can be connected to the inner parts of the leads by the bonding wires 17 without inverting the lead frame (without inverting the chip).

The electrodes of plural chips (in this embodiment, the electrodes of two chips) can be wire-bonded to the inner part of one lead, so it is unnecessary to use plural lead frames.

In this process, the ends of the inner parts of the leads 22A are disposed in the vicinity of the electrodes 15 of the chip 11, so the length of the bonding wires 17 which electrically connect the electrodes 15 of the chip 11 with the inner parts of the leads 22A, and the length of the bonding wires 17 which electrically connect the electrodes 15 of the chip 12 with the inner parts of the leads 22A, can be made short.

In this process, the four chips are laminated in positions offset with respect to one another so that the other long side 11A2 of the chip 11 is situated further outside than the other long side 12A2 of the chip 12, the other long side 12A2 of the chip 12 is situated further outside than the other long side 13A2 of the chip 13, and the other long side 13A2 of the chip 13 is situated further outside than the other long side 14A2 of the chip 14, so the rear surface spaces on the other long sides are exposed from the opposite chip. Therefore, by providing a projecting part or step part on the heat stage 30 so that it comes in contact with these rear surface spaces, the heat stage can be directly or indirectly brought into contact with the rear surface spaces on the other long sides of the three chips.

In this process, the chip 11 and chip 12 are adhesion-fixed and offset with respect to one another such that the spaces between the electrodes 15 of the chip 11 are opposite the electrodes 15 of the chip 12, so short-circuits between the bonding wires 17 connected to the electrodes 15 of the chip 11 with the bonding wires 17 connected to the electrodes of the chip 12 can be suppressed.

In this process, the chip 13 and chip 14 are adhesion-fixed and offset with respect to one another such that the spaces between the electrodes 15 of the chip 14 are opposite the electrodes 15 of the chip 13, so short-circuits between the bonding wires 17 connected to the electrodes 15 of the chip 13 with the bonding wires 17 connected to the electrodes of the chip 14 can be suppressed.

Next, the four chips (11, 12, 13, 14), the inner parts of the leads 22A, the inner parts of the leads 22B and the bonding wires 17 are sealed by resin to form the resin sealing body 18. The resin sealing body 18 is formed by transfer molding.

Next, the tie bar 25 connected to the leads 22A and the tie bar 22 connected to the leads 22B are cut, the outer parts of the leads 22A and leads 22B are plated, the leads 22A, 22B are cut from the frame body 21 of the lead frame LF1, and the outer parts of the leads 22A, 22B are bent in a gull wing shape which is one type of surface-mounted lead shape. Subsequently, the semiconductor device 1A shown in FIG. 1 and FIG. 2 is effectively finished by separating the resin sealing body 18 from the frame body 14 of the lead frame LF1.

Figure 8:
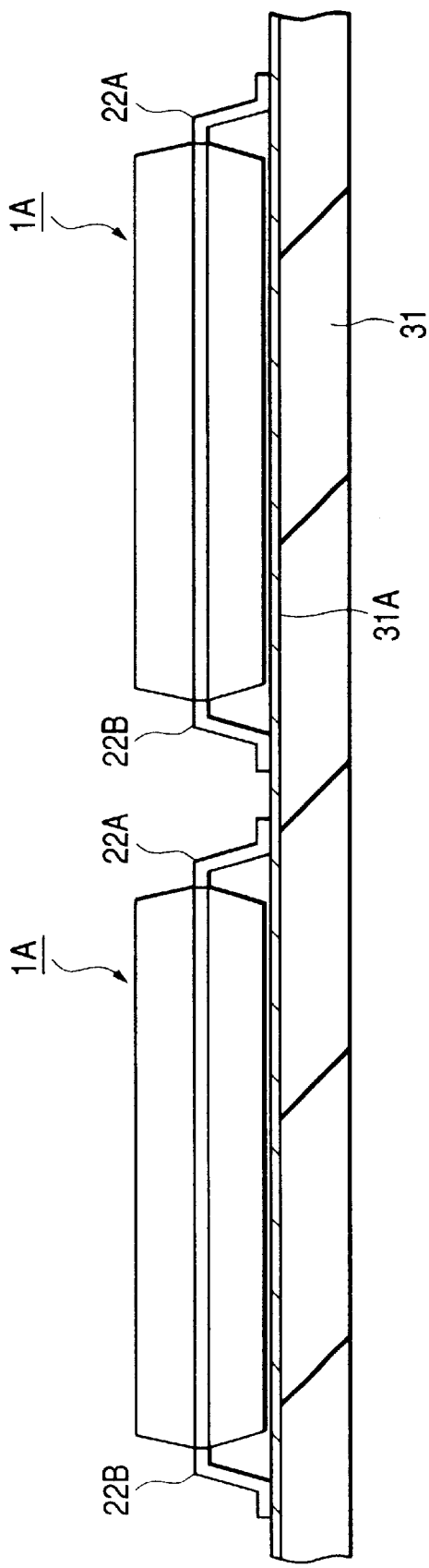
FIG. 8 is a schematic cross-sectional view showing the semiconductor device according to the first embodiment of this invention mounted on a mounting substrate.

The plural semiconductor devices 1A thus formed are then mounted on a mounting substrate 31 which is a component part of an electrical device comprising one circuit system, as shown in FIG. 8 (schematic cross-sectional view of essential parts). In the semiconductor device 1A, leads having identical functions are arranged opposite each other, so interconnections 31A for electrically connecting the leads 22A and leads 22B can be drawn in straight lines. The interconnections 31A for electrically connecting the leads 22A and leads 22B can be drawn in straight lines, and the interconnections 31A for electrically connecting the leads 22B of the semiconductor device 1A and the leads 22A of another semiconductor device 1A can also be drawn in straight lines. Therefore, the number of interconnection layers of the mounting substrate 31 can be reduced, and electronic devices such as for example memory modules can be made thinner.

The following are the attendant advantages offered by this embodiment as described hereabove.

(1) In the four chips (11, 12, 13, 14), the rear surface of the chip 11 and circuit-forming surface 12A of the chip 12 are aligned such that one of the long sides (11A1, 12A1) of the chips 11, 12 is situated on the side of the leads 22B, and the chips 11, 12 are adhesion-fixed in positions offset with respect to one another such that the electrodes 15 of the chip 12 are situated further outside than the long side 11A1 of the chip 11.

The rear surface of the chip 12 and circuit-forming surface 12A of the chip 13 are aligned such that one of the long sides (11A1, 12A1) of the chip 13 is situated on the side of the leads 22B, and the chips 12, 13 are adhesion-fixed in positions offset with respect to one another such that the electrodes 15 of the chip 13 are situated further outside than the long side 11A1 of the chip 12.

The rear surface of the chip 13 and circuit-forming surface 14A of the chip 14 are aligned such that one of the long sides (11A1, 12A1) of the chip 14 is situated on the side of the leads 22B, and the chips 13, 14 are adhesion-fixed in positions offset with respect to one another such that the electrodes 15 of the chip 14 are situated further outside than the long side 11A1 of the chip 14.

Due to this construction, in a wire bonding step, the electrodes 15 of the four chips and inner parts of the leads can be connected by the bonding wires 17 without inverting the lead frame LF1 (without inverting the chips), so the deformation of the bonding wires 17 due to inversion of the lead frame LF1 can be eliminated. As a result, the yield of the semiconductor device 1A can be improved.

Plural electrodes (in this embodiment, the electrodes of two chips) can be wire bonded to the inner part of one lead, so the semiconductor device 1A can be manufactured without using plural lead frames. As a result, the cost of the semiconductor device 1A can be lowered.

As there is no need to invert the lead frame LF1, the productivity of the semiconductor device 1A is improved.

In the four chips, the electrodes 15 having identical functions are arranged facing each other, so there is no need to use chips having a mirror-inverted circuit pattern. Therefore, the cost of the semiconductor device 1A can be lowered.

(2) The four chips are laminated in positions offset with respect to each other so that the other long side 11A2 of the chip 11 is situated further outside than the other long side 12A2 of the chip 12, the other long side 12A2 of the chip 12 is situated further outside than the other long side 13A2 of the chip 13, and the other long side 13A2 of the chip 13 is situated further outside than the other long side 14A2 of the chip 14.

Due to this construction, the rear surface regions on the other long sides of the three chips, excepting the lowermost chip 14, are exposed from the opposite chip, so the heat stage can be directly or indirectly brought into contact with the rear surface regions on the other long side of the three chips. Hence, the chips can easily be heated to the temperature required for wire bonding, and bad contacts between the chip electrodes and bonding wires can be reduced. This leads to an improvement of yield in the manufacturing process (assembly process) for manufacturing the semiconductor device.

(3) The ends of the inner parts of the leads 22A are disposed in the vicinity of the electrodes 15 of the chip 11. Due to this construction, the length of the bonding wires 17 which electrically connect the electrodes 15 of the chip 11 with the inner parts of the leads 22A, and the length of the bonding wires 17 which electrically connect the electrodes 15 of the chip 12 with the inner parts of the leads 22A, is can be shortened. As a result, the semiconductor device 1A can be made high speed.

(4) The chip 11 and the chip 12 are adhesion-fixed in positions offset with respect one another so that the gaps between the electrodes 15 of the chip 11 are opposite the electrodes 15 of the chip 12. The chip 13 and the chip 14 are adhesion-fixed in positions offset with respect one another so that the gaps between the electrodes 15 of the chip 14 are opposite the electrodes 15 of the chip 13. Due to this construction, short-circuits between the bonding wires 17 connecting the electrodes 15 of the chip 11 and the bonding wires 17 connecting the electrodes of the chip 12, can be suppressed. Also, short-circuits between the bonding wires 17 connecting the electrodes 15 of the chip 13 and the bonding wires 17 connecting the electrodes of the chip 14, can be suppressed. As a result, the yield of the semiconductor device can be improved.

In this embodiment, a semiconductor device was described wherein four chips were laminated and these four semiconductor chips were sealed in a resin sealing body, but the invention is not limited to this case, and may be applied also to a semiconductor device wherein for example two, three or more than four chips are laminated, these chips being sealed in a resin sealing body.

(Embodiment 2)

Figure 9:
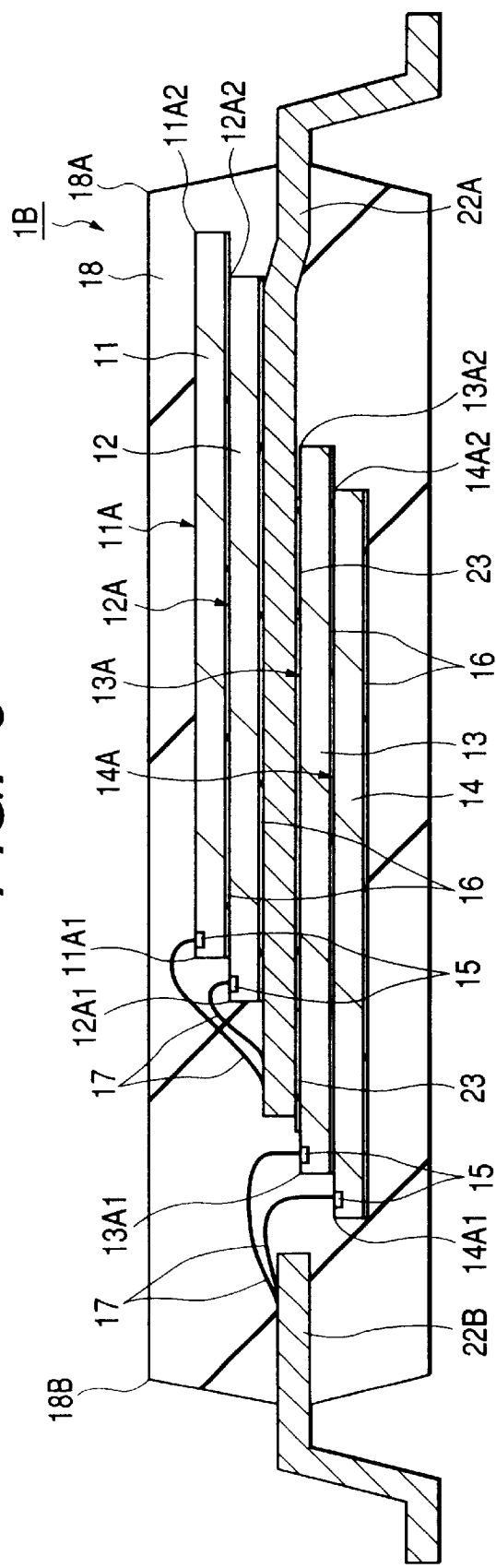
FIG. 9 is a schematic cross-sectional view of a semiconductor device according to a second embodiment of this invention.

FIG. 9 is a schematic cross-sectional view of a semiconductor device according to a second embodiment of this invention.

As shown in FIG. 9, a semiconductor device 1B of this embodiment basically has an identical construction to that of the aforesaid first embodiment, the following features being different.

The four chips (11, 12, 13, 14) are laminated interposing the midparts of the inner parts of the leads 22A between the chip 12 and chip 13.

The rear surface of the chip 12 faces the midparts of the inner parts of the leads 22A, and the chip 12 is adhesion-fixed to the midparts of the inner parts of the leads 22A so that the ends of the inner parts of the leads 22A are situated further outside than the long side 12A1 of the chip 12. The adhesion of the chip 12 to the midparts of the inner parts of the leads 22A is accomplished by the adhesive layer 16 interposed between them.

The circuit-forming surface 13A of the chip 13 faces the midparts of the inner parts of the leads 22A, and the chip 13 is adhesion-fixed to the midparts of the inner parts of the leads 22A so that the electrodes 15 of the chip 13 are situated further outside than the ends of the inner parts of the leads 22A. The adhesion of the chip 13 to the midparts of the inner parts of the leads 22A is accomplished by the adhesive layer 16 interposed between them. In the case of this construction also, an identical effect is obtained to that of the aforesaid first embodiment.

The bending amount (offset amount) of the inner parts of the leads 22A is less than that of the aforesaid embodiment, alternatively the bending of the inner parts of the leads 22A can be dispensed with, so productivity of the semiconductor device is improved.

The loop heightof the bonding wires 17 connected to the electrodes 15 of the chip 11 and chip 12 can be reduced, so the semiconductor device can be made thinner than in the case of the aforesaid first embodiment.

In this embodiment, the case was described where the midparts of the inner parts of the leads 22A were disposed between the chip 12 and chip 13, but the midparts of the inner parts of the leads 22A may also be disposed between the chip 11 and chip 12, or between the chip 13 and chip 14. In this case however, the distribution of the bonding wires 17 will be uneven.

(Embodiment 3)

Figure 10:
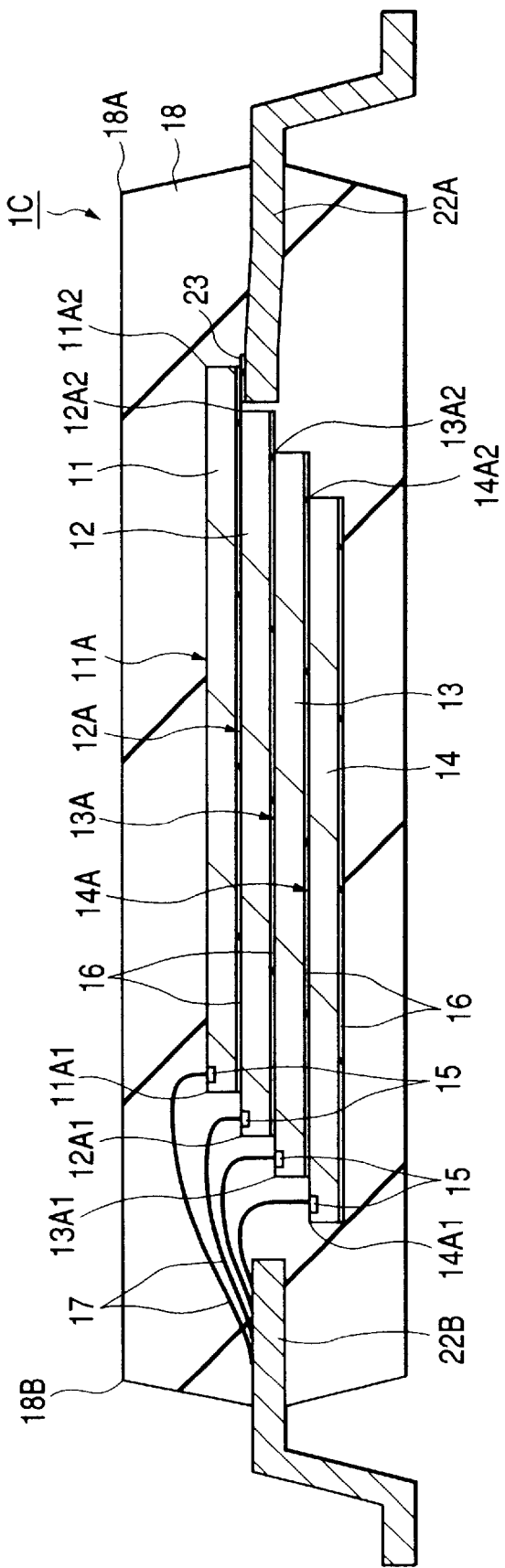
FIG. 10 is a schematic cross-sectional view of a semiconductor device according to a third embodiment of this invention.

FIG. 10 is a schematic cross-sectional view of a semiconductor device according to a third embodiment of this invention.

As shown in FIG. 10, a semiconductor device 1C of this embodiment basically has an identical construction to that of the aforesaid first embodiment, the following features being different.

Specifically, the electrodes 15 of the four chips (11, 12, 13, 14) are respectively electrically connected to the inner parts of the leads 22B via the bonding wires 17. The ends of the inner parts of the leads 22A are made to adhere to the rear surface of the chip 11 via the adhesive layer (16 or 23) outside the other long side 12A2 of the chip 12.

In this construction also, an identical effect that of the aforesaid first embodiment is obtained.

The thickness of the leads 22A is absorbed by the thickness of the laminated chip body comprising the four chips, so the semiconductor device can be made thinner than in the case of the aforesaid first embodiment.

In this embodiment, the case was described where the ends of the inner parts of the leads 22A were made to adhere to the rear surface of the chip 11, but the ends of the inner parts of the leads 22A may be made to adhere also to the rear surface of any of the chips 12, 13, 14.

(Embodiment 4)

Figure 11:
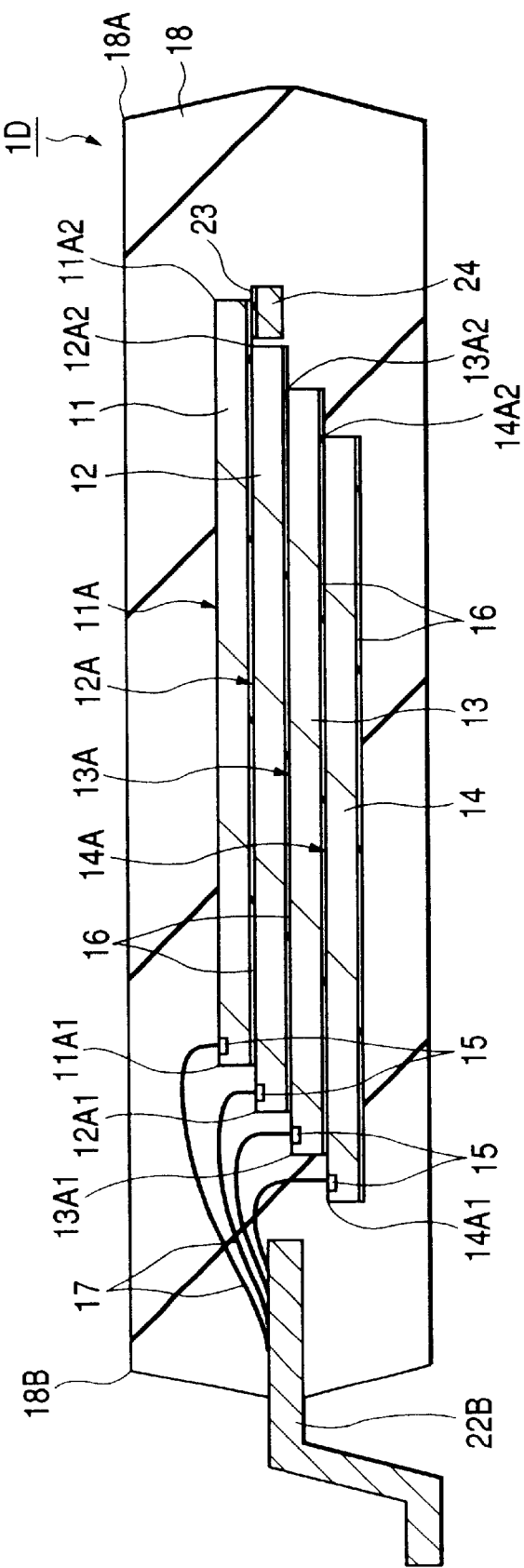
FIG. 11 is a schematic cross-sectional view of a semiconductor device according to a fourth embodiment of this invention.

FIG. 11 is a schematic cross-sectional view of a semiconductor device according to a third embodiment of this invention.

As shown in FIG. 11, a semiconductor device 1D of this embodiment basically has an identical construction to that of the aforesaid first embodiment, the following features being different.

Specifically, the electrodes 15 of the four chips (11, 12, 13, 14) are respectively electrically connected to the inner parts of the leads 22B via the bonding wires 17. Supporting leads 24 are made to adhere to the rear surface of the chip 11 via the adhesive layer (16 or 23) outside the other long side 12A2 of the chip 12.

In the case of this construction also, an identical effect that of the aforesaid first embodiment is obtained.

As there are no leads on a side 18A of the resin sealing body 18, the semiconductor device can be made more compact.

(Embodiment 5)

Figure 12:
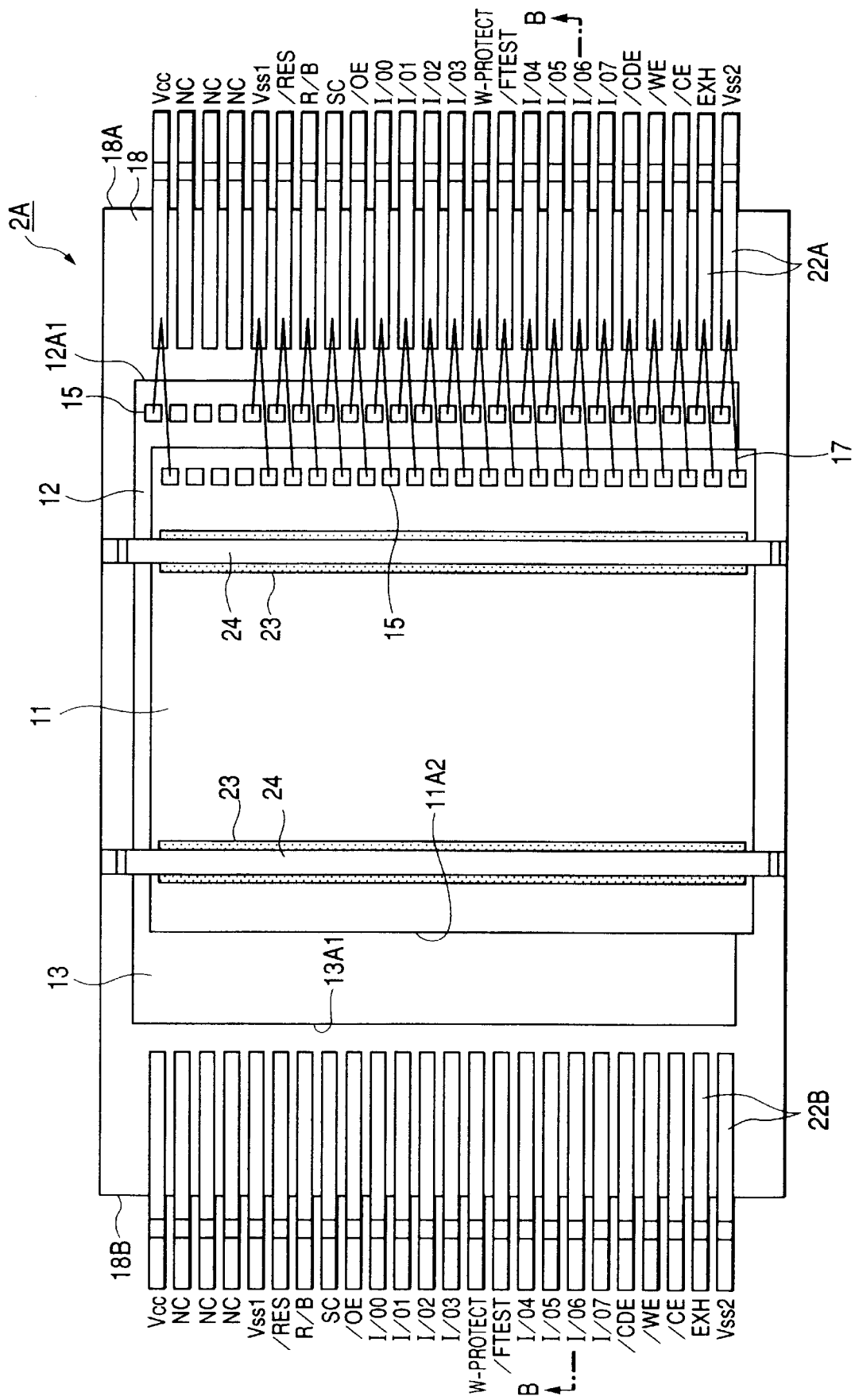
FIG. 12 is a schematic plan view showing a semiconductor device which is a fifth embodiment of this invention with the upper part of a resin sealing body removed.
Figure 13:
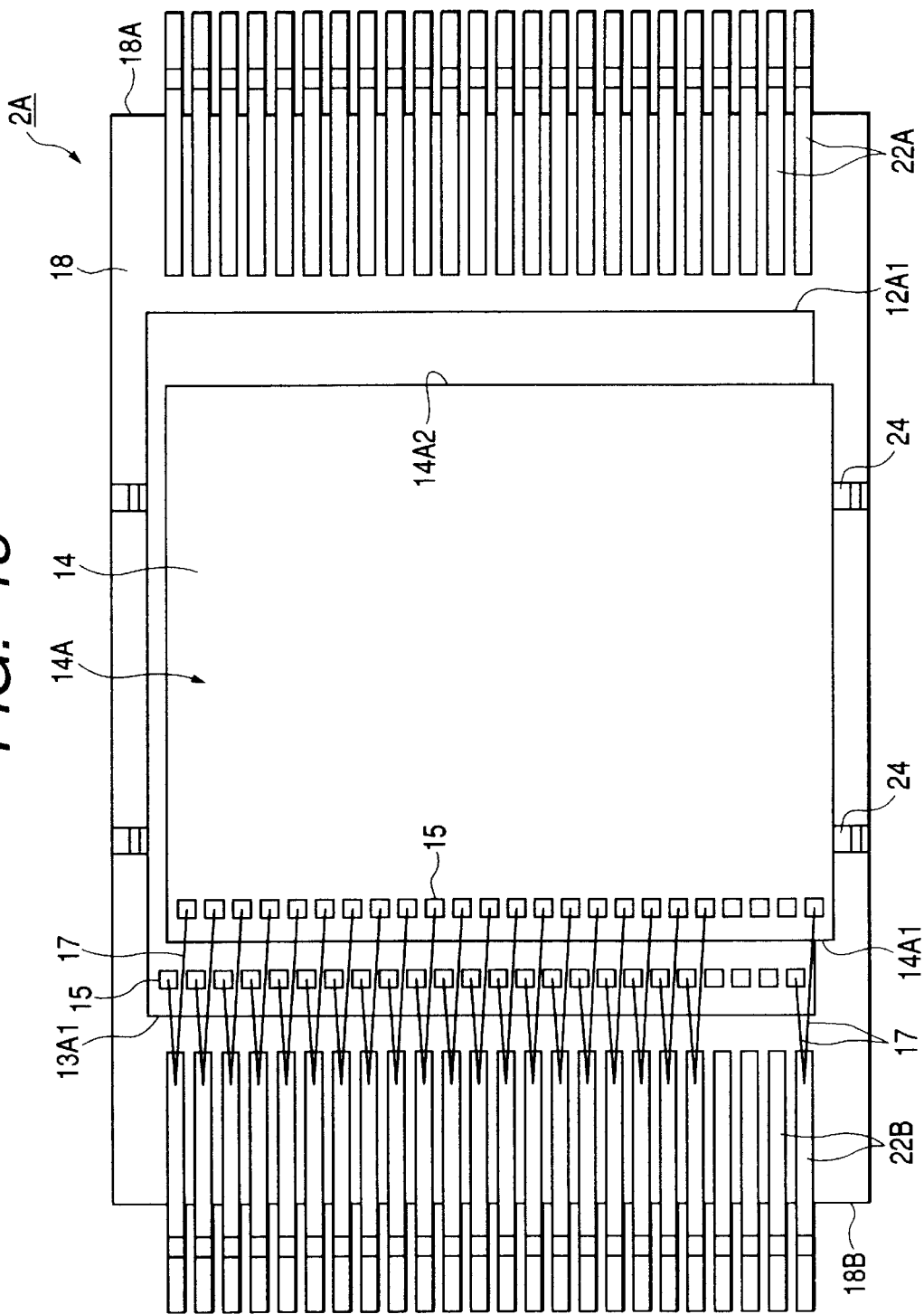
FIG. 13 is a schematic plan view showing a semiconductor device which is the fifth embodiment of this invention with the lower part of the resin sealing body removed.
Figure 14:
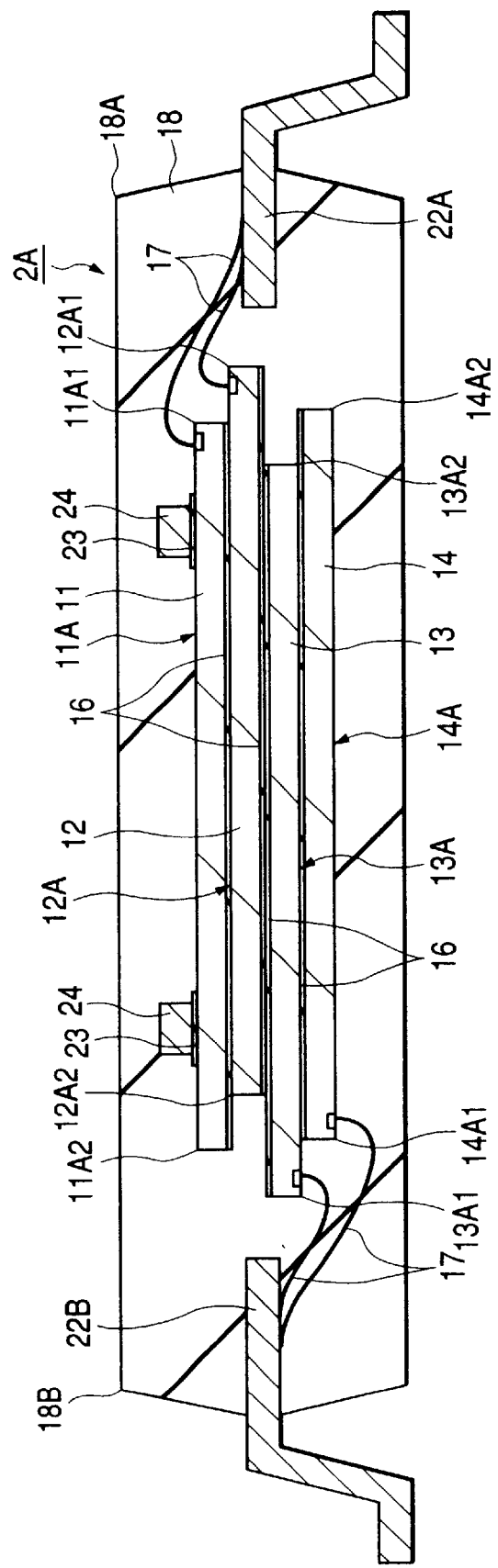
FIG. 14 is a schematic cross-sectional view along a line B—B in FIG. 1.

FIG. 12 is a schematic plan view showing the semiconductor device according to a fifth embodiment of this invention with the upper part of the resin sealing body removed, FIG. 13 is a schematic plan view showing the aforesaid semiconductor device with the upper part of the resin sealing body removed, and FIG. 14 is a schematic sectional view along a line B—B in FIG. 12.

As shown in FIG. 12 to FIG. 14, a semiconductor device 2A according to this embodiment differs in the way the chip is laminated from that of the aforesaid first embodiment.

The rear surface of the chip 12 and circuit-forming surface 12A of the chip 12 are aligned such that one of the long sides (11A1, 12A1) of the chips 11, 12 is situated on the side of the leads 22A. The chips 11, 12 are adhesion-fixed in positions offset with respect to one another such that the electrodes 15 of the chip 12 are situated further outside than the long side 11A1 of the chip 11, and the other long side 11A2 of the chip 11 is situated further outside than the other long side of the chip 12.

The rear surface of the chip 12 and rear surface 13 of the chip 13 are aligned such that the long side 13A1 of the chip 13 is situated on the side of the leads 22B. The chips 12, 13 are adhesion-fixed in positions offset with respect to one another such that the long side 13A1 of the chip 13 is situated further outside than the other long side 11A2 of the chip 11, and the other long side 13A2 of the chip 13 is situated further inside than the long side 12A1 of the chip 12.

The circuit-forming surface 13A of the chip 13 and rear surface 12A of the chip 14 are aligned such that the long side 14A1 of the chip 14 is situated on the side of the leads 22B. The chips 13, 14 are adhesion-fixed in positions offset with respect to one another such that the electrodes 15 of the chip 13 are situated further outside than the long side 14A1 of the chip 14, and the long side 12A1 of the chip 12 is situated further outside than the other long side 14A2 of the chip 14.

Two of the supporting leads 24 which support the chip 11 are adhesion-fixed to the circuit-forming surface 11A of the chip 11 via the adhesive layer 23.

Figure 15:
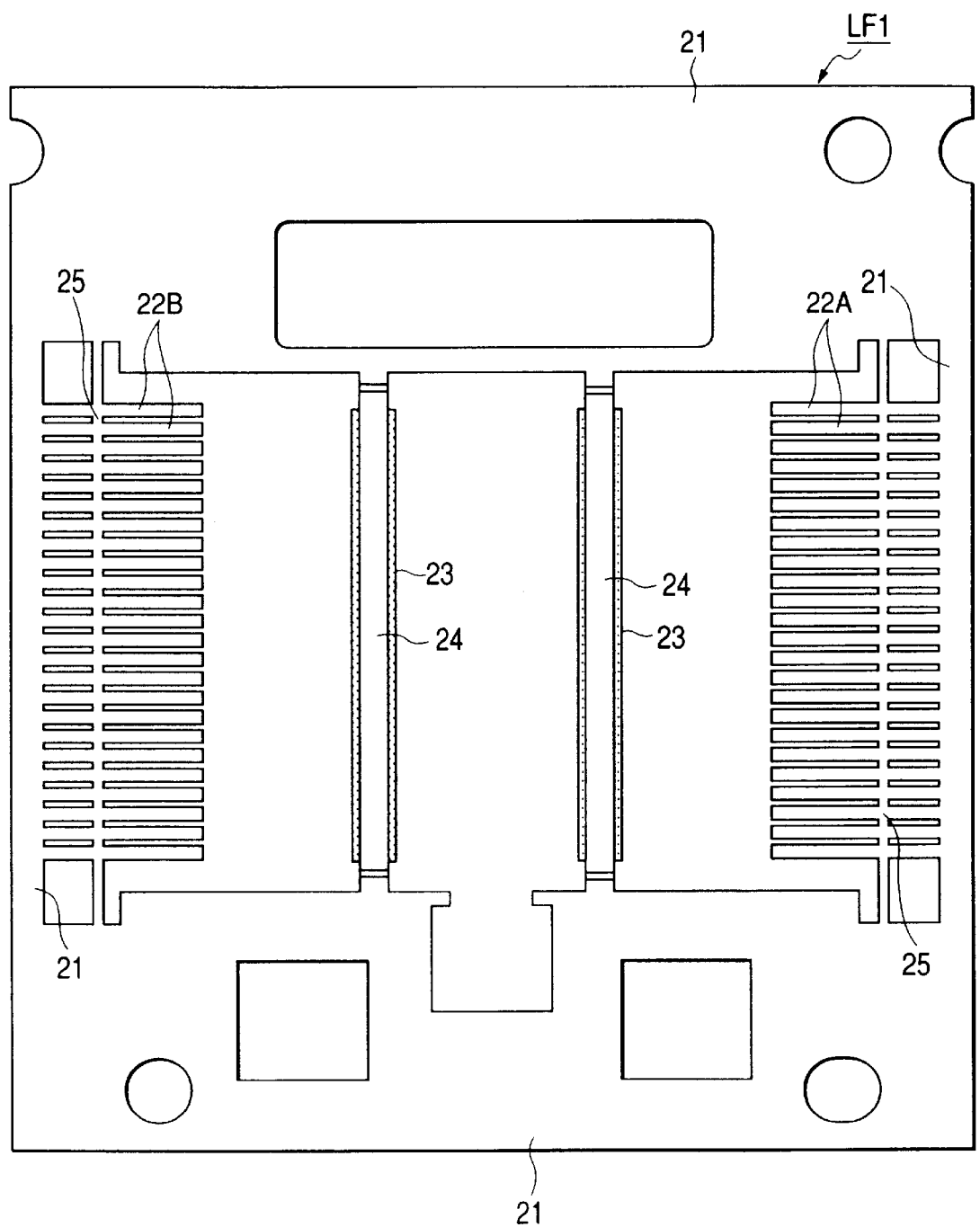
FIG. 15 is a schematic plan view of a lead frame used in a process for manufacturing the semiconductor device according to the fifth embodiment of this invention.

The semiconductor device 2A of this embodiment is formed by a manufacturing process using a lead frame LF2 shown in FIG. 15. The lead frame LF2 is slightly different to the aforesaid lead frame LF1, and comprises two of the supporting leads 24 between the leads 22A and the leads 22B. The lengths of the leads 22A and leads 23B are basically identical.

Figure 16A:
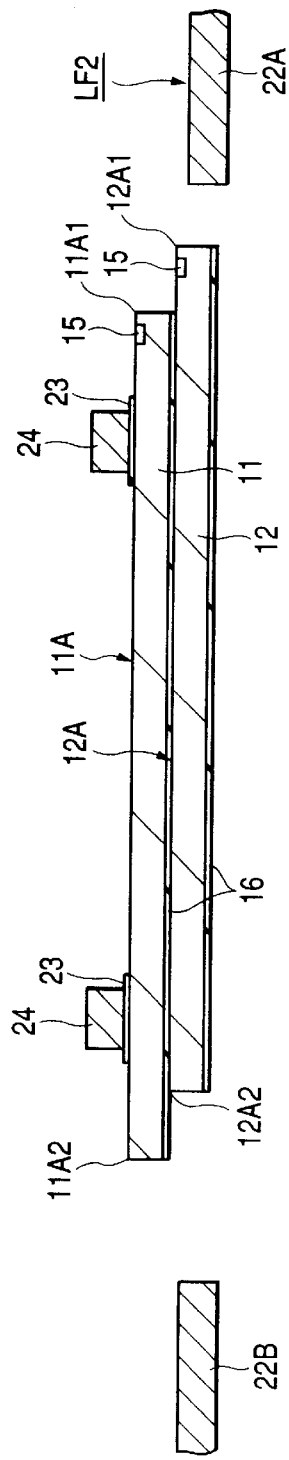
FIG. 16 is a schematic cross-sectional view describing the manufacture of the semiconductor device according to the fifth embodiment of this invention.
Figure 16B:
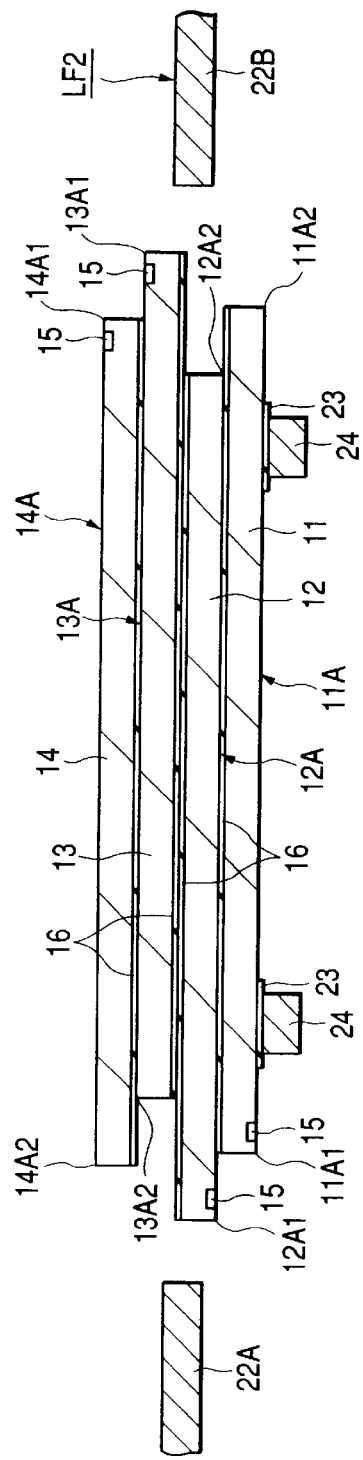
Figure 17:
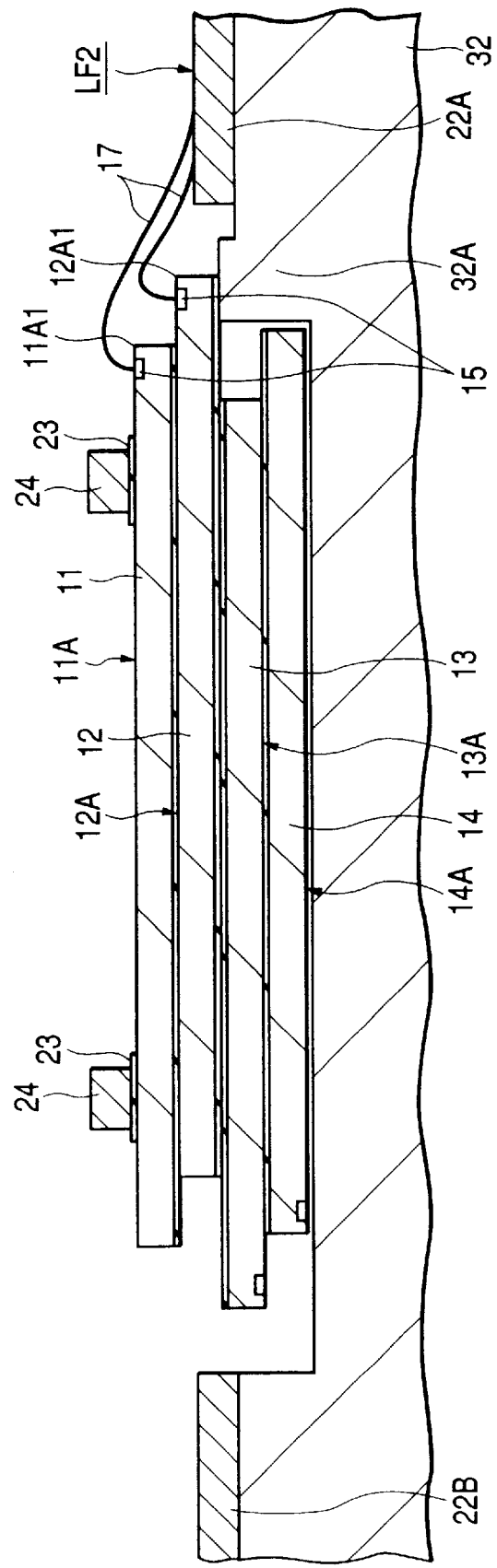
FIG. 17 is a schematic cross-sectional view describing the manufacture of the semiconductor device according to the fifth embodiment of this invention.
Figure 18:
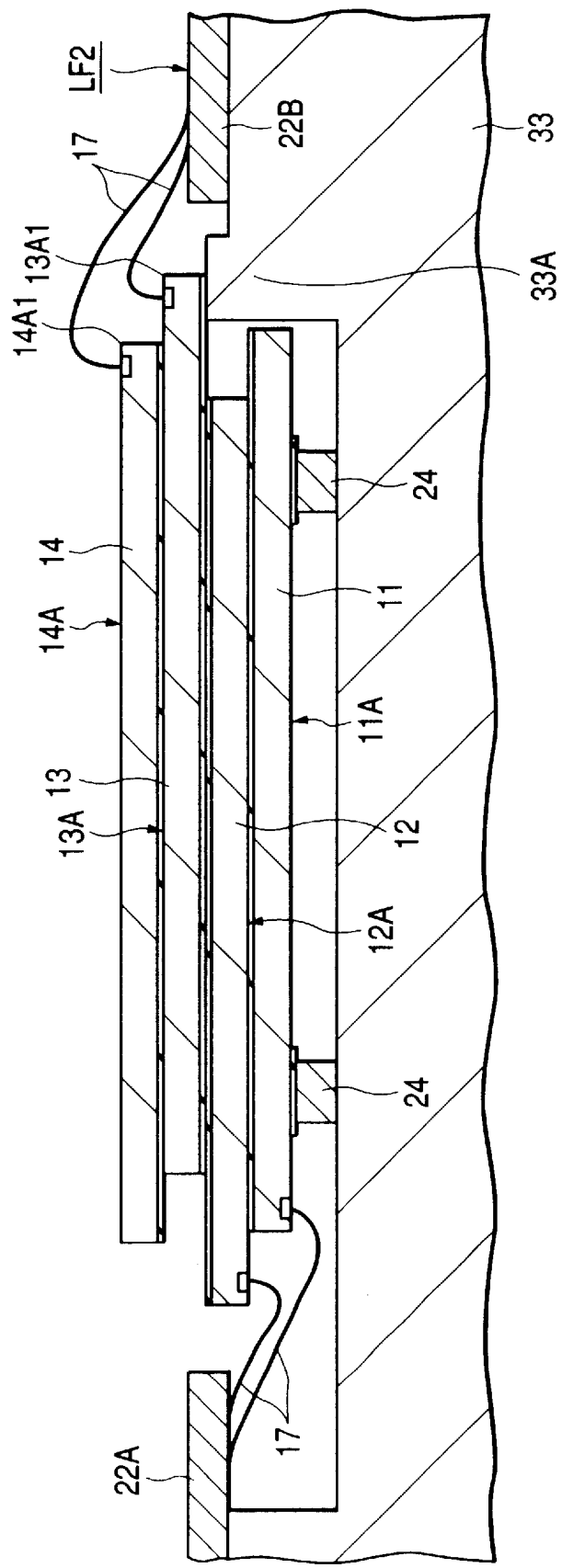
FIG. 18 is a schematic cross-sectional view describing the manufacture of the semiconductor device according to the fifth embodiment of this invention.

Next, the manufacture of the semiconductor device 2A will be described referring to FIG. 16 to FIG. 18 (schematic cross-sectional views).

First, the chip 11 is adhesion-fixed to the lead frame LF2. The lead frame LF2 is fixed to the semiconductor chip 11 by making the supporting lead 24 adhere to the circuit-forming surface 11A of the chip 11 via the adhesive layer 23, as shown in FIG. 16(a). At this time, the chip 11 is arranged such that the long side 11A1 of the chip 11 is situated on the side of the leads 22A (on the side of one of the two sets of mutually opposite leads).

Next, the chip 12 is adhesion-fixed to the chip 11. The chip 11 is fixed to the chip 12 by fixing the circuit-forming surface 12A of the chip 12 to the rear surface of the chip 11 via the adhesive layer 16, as shown in FIG. 16(a). At this time, the chip 12 is arranged such that the long side 12A1 of the chip 12 is situated on the side of the leads 22A. The chip 11 and chip 12 are offset with respect to one another so that the electrodes 15 of the chip 12 are situated further outside than the long side 11A1 of the chip 11, and the other long side 11A2 of the chip 11 is situated further outside than the other long side 12A2 of the chip 12. Further, the chip 11 and chip 12 are offset with respect to one another so that the spaces between the electrodes 15 of the chip 11 are opposite the electrodes 15 of the chip 12.

Next, after the lead frame LF2 is inverted so that the rear surface of the chip 12 is facing upwards, the chip 13 is adhesion-fixed to the chip 12. The chip 12 is fixed to the chip 13 by fixing the rear surface of the chip 13 to the rear surface of the chip 12 via the adhesive layer 16, as shown in FIG. 16(b). At this time, the chip 13 is arranged such that the long side 13A1 of the chip 13 is situated on the side of the leads 22B. The chip 12 and chip 13 are offset with respect to one another so that the long side 13A1 of the chip 13 is situated further outside than the other long side 11A2 of the chip 11, and the long side 12A1 of the chip 12 is situated further outside than the short side 13A2 of the chip 13. The offset amounts of the chip 13 and chip 12 are preferably such that the electrodes 15 of the chip 13 are situated further outside than the long side 11A1 of the chip 11, and the electrodes 15 of the chip 12 are situated further outside than the other long side 13A2 of the chip 13.

Next, the chip 14 is adhesion-fixed to the chip 13. The chip 13 is fixed to the chip 14 by fixing the rear surface of the chip 14 to the circuit-forming surface 13A of the chip 13 via the adhesive layer 16, as shown in FIG. 16(b). At this time, the chip 14 is arranged such that the long side 14A1 of the chip 14 is situated on the side of the leads 22B. The chip 13 and chip 14 are offset with respect to one another such that the electrodes 15 of the chip 13 are situated further outside than the long side 14A1 of the chip 14, and the electrodes 15 of the chip 12 are situated further outside than the other long side 14A2 of the chip 14. The chip 13 and chip 14 are also offset with respect to one another such that the spaces between the electrodes 15 of the chip 14 are opposite the electrodes of the chip 13. As a result of this step, the four chips (11, 12, 13, 14) are laminated.

Next, the electrodes 15 of the chip 11 and chip 12 are electrically connected to the inner parts of the leads 22A by the bonding wires 17. The connection between the chips 11, 12 and the inner parts of the leads 22A is accomplished by inserting the lead frame LF2 into a heat stage 32 with the circuit-forming surface 11A of the chip 11 facing upwards, as shown in FIG. 17. In this step, the long side 12A1 of the chip 12 is situated further outside than the other long side 13A2 of the chip 13 and the other long side 14A2 of the chip 14, so by providing a projecting part 32A in the heat stage 32 so that it comes in contact with the rear surface region on the side of the long side 12A1 of the chip 12, the heat stage 32 can be brought directly or indirectly into contact with the rear surface region on the side of the long side 12A1 of the chip 12.

Next, the electrodes 15 of the chip 13 and chip 14 are electrically connected to the inner parts of the leads 22B by the bonding wires 17. The connection between the chips 13, 14 and the inner parts of the leads 22B is accomplished by inserting the lead frame LF2 into a heat stage 33 with the circuit-forming surface 14A of the chip 14 facing upwards, as shown in FIG. 18. In this step, the long side 13A1 of the chip 13 is situated further outside than the other long side 12A2 of the chip 12 and the other long side 11A2 of the chip 11, so by providing a projecting part 33A in the heat stage 33 so that it comes in contact with the rear surface region on the side of the long side 13A1 of the chip 13, the heat stage 33 can be brought directly or indirectly into contact with the rear surface region on the side of the long side 13A1 of the chip 13.

Subsequently, by performing identical manufacturing steps to those of the aforesaid first embodiment, the semiconductor device 2A shown in FIG. 12 to FIG. 14 is effectively finished.

As described above, the following advantages are obtained according to this embodiment.

In the four chips, the rear surface of the chip 11 and the circuit-forming surface 12A of the chip 12 are aligned such that the long side 11A1 of the chip 11 and the long side 12A1 of the chip 12 are situated on the side of the leads 22A. The chips 11, 12 are adhesion-fixed in positions offset with respect to one another such that the electrodes 15 of the chip 12 are situated further outside than the long side 11A1 of the chip 11, and such that the other long side 11A2 of the chip 11 is situated further outside than the other long side 12A2 of the chip 12.

The rear surface of the chip 12 and rear surface of the chip 13 are aligned such that the electrodes 15 of the chip 13 are situated on the side of the leads 22B. The chips 12, 13 are adhesion-fixed in positions offset with respect to one another such that the long side 13A1 of the chip 13 is situated further outside than the other long side 12A2 of the chip 12, and the long side 12A1 of the chip 12 is situated further outside than the other long side 13A2 of the chip 13.

The circuit-forming surface 13A of the chip 13 and rear surface 14 of the chip 14 are aligned such that the long side 14A1 of the chip 14 is situated on the side of the leads 22B. The chips 13, 14 are adhesion-fixed offset with respect to one another such that the electrodes 15 of the chip 14 are situated further outside than the long side 14A1 of the chip 14, and the long side 12A1 of the chip 12 is situated further outside than the other long side 14A2 of the chip 14.

Due to this construction, in a wire bonding step, the heat stage 32 can be directly or indirectly brought into contact with the rear surface region on the side of the long side 12A1 of the chip 12, so the chips 11, 12 can easily be heated to the temperature required for wire bonding, and bad contacts between the chip electrodes and the bonding wires can be reduced. Also, the heat stage 33 can be directly or indirectly brought into contact with the rear surface region on the side of the long side 13A1 of the chip 13, so the chips 11, 12 can easily be heated to the temperature required for wire bonding, and bad contacts between the chip electrodes and the bonding wires can be reduced. This leads to an improvement of yield in the manufacturing process (assembly process) for manufacturing the semiconductor device.

(Embodiment 6)

Figure 19:
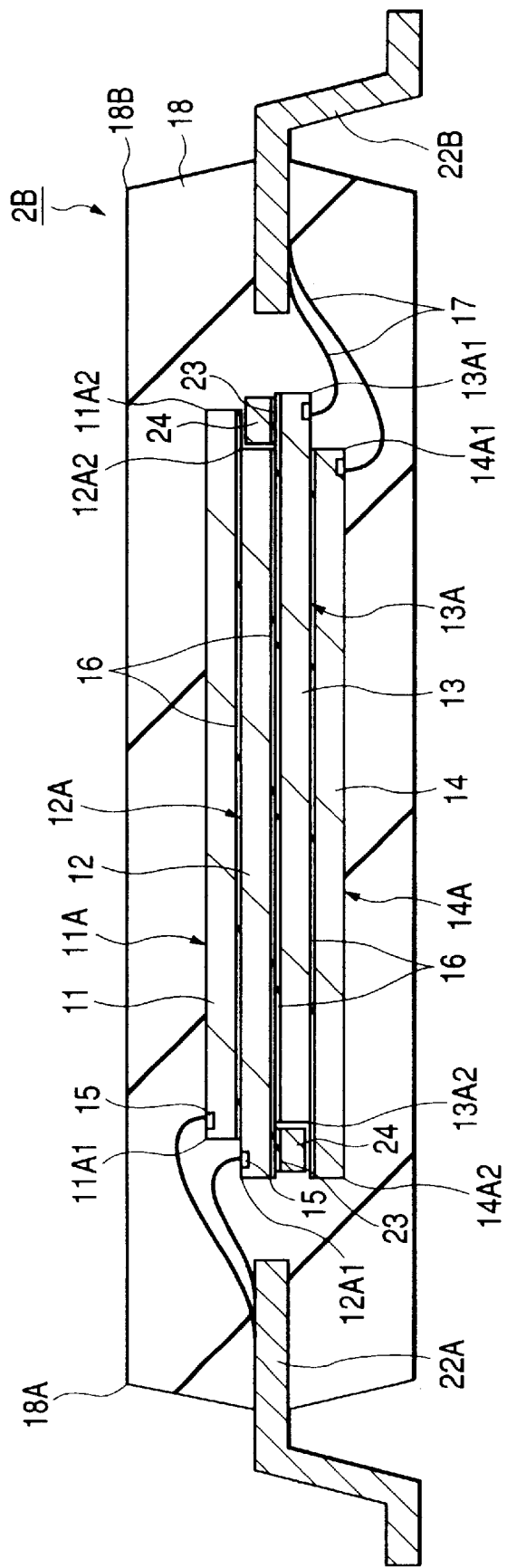
FIG. 19 is a schematic cross-sectional view of a semiconductor device according to a sixth embodiment of this invention.

FIG. 19 is a schematic cross-sectional view showing the semiconductor device according to a sixth embodiment of this invention.

As shown in FIG. 19, a semiconductor device 2B according to this embodiment basically has an identical construction to that of the aforesaid fifth embodiment.

In the four chips, the rear surface of the chip 11 and circuit-forming surface 12A of the chip 12 are aligned such that the long side 11A1 of the chip 11 and the long side 12A1 of the chip 12 are situated on the side of the leads 22A. The chips 11, 12 are adhesion-fixed offset with respect to one another such that the electrodes 15 of the chip 12 are situated further outside than the long side 11A1 of the chip 11, and the other long side 11A2 of the chip 11 is situated further outside than the other long side 12A2 of the chip 12.

The rear surface of the chip 12 and rear surface 13 of the chip 13 are aligned such that the electrodes 15 of the chip 13 are situated on the side of the leads 22B. The chips 12, 13 are adhesion-fixed offset with respect to one another such that the long side 13A1 of the chip 13 is situated further outside than the other long side 12A2 of the chip 12, and the long side 12A1 of the chip 12 is situated further outside than the other long side 13A2 of the chip 13.

The circuit-forming surface 13A of the chip 13 and rear surface of the chip 14 are aligned such that the long side 14A1 of the chip 14 is situated on the side of the leads 22B. The chips 13, 14 are adhesion-fixed offset with respect to one another such that the electrodes 15 of the chip 13 are situated further outside than the long side 14A1 of the chip 14.

Of the two supporting leads 24, one of the supporting leads 24 is adhesion-fixed to the rear surface of the chip 12 outside the other long side 13A2 of the chip 13, and the other supporting lead 24 is adhesion-fixed to the rear surface of the chip 13 outside the other long side 12A2 of the chip 12.

In this construction also, an identical effect that of the first embodiment is obtained.

Further, the thickness of the supporting leads 24 is absorbed by the thickness of the laminated chip and body comprising the four chips, so the semiconductor device can be made thinner than in the aforesaid fifth embodiment.

(Embodiment 7)

Figure 20:
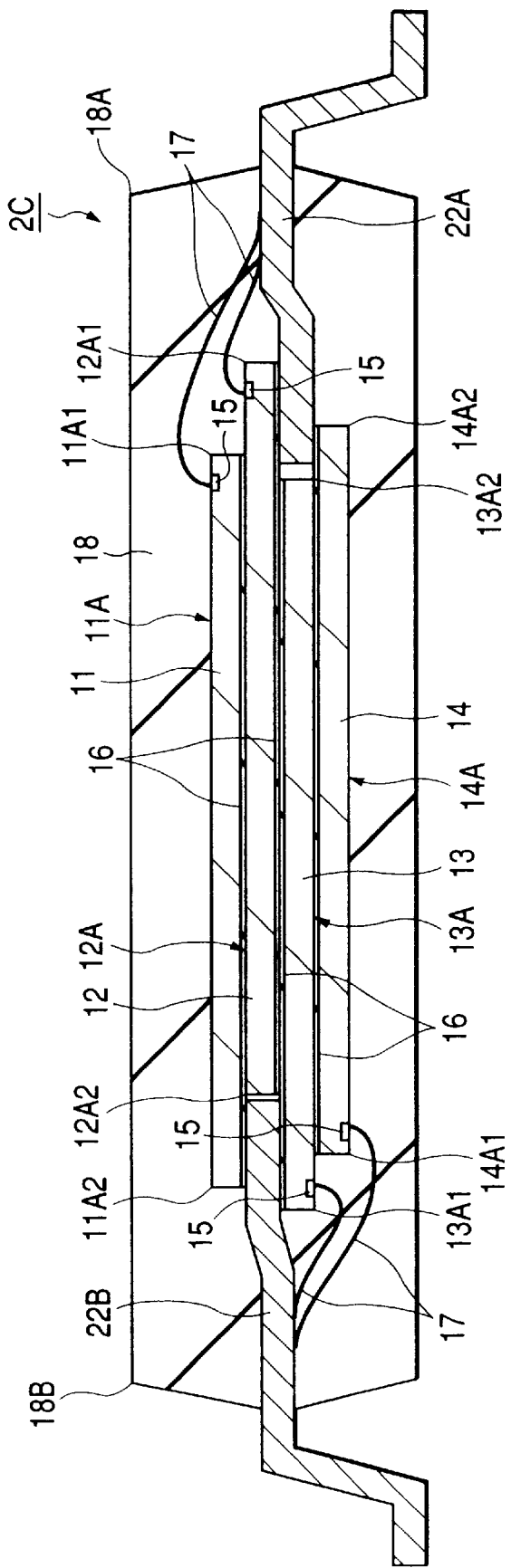
FIG. 20 is a schematic cross-sectional view of a semiconductor device according to a seventh embodiment of this invention.

FIG. 20 is a schematic cross-sectional view showing the semiconductor device according to a seventh embodiment of this invention.

As shown in FIG. 20, a semiconductor device 2C according to this embodiment basically has an identical construction to that of the aforesaid fifth embodiment.

In the four chips, the rear surface of the chip 11 and circuit-forming surface 12A of the chip 12 are aligned such that one of the long sides 11A1 of the chip 11 and one of the long sides 12A1 of the chip 12 are situated on the side of the leads 22A. The chips 11, 12 are adhesion-fixed offset with respect to one another such that the electrodes 15 of the chip 12 are situated further outside than the long side 11A1 of the chip 11, and the other long side 11A2 of the chip 11 is situated further outside than the other long side 12A2 of the chip 12.

The rear surface of the chip 12 and rear surface 13 of the chip 13 are aligned such that the long side 13A1 of the chip 13 is situated on the side of the leads 22B. The chips 12, 13 are adhesion-fixed offset with respect to one another such that the long side 13A1 of the chip 13 is situated further outside than the other long side 12A2 of the chip 12, and the long side 12A1 of the chip 12 is situated further outside than the other long side 13A2 of the chip 13.

The circuit-forming surface 13A of the chip 13 and rear surface of the chip 14 are aligned such that the long side 14A1 of the chip 14 is situated on the side of the leads 22B. The chips 13, 14 are adhesion-fixed offset with respect to one another such that the electrodes 15 of the chip 13 are situated further outside than the long side 14A1 of the chip 14, and the other long side 14A2 of the chip 14 is situated further outside than the other long side 13A2 of the chip 13.

The ends of the leads 22A are adhesion-fixed to the rear surface of the chip 12 and rear surface of the chip 14 outside the the other long side 13A2 of the chip 13, and the ends of the leads 22B are adhesion-fixed to the rear surface of the chip 11 and rear surface of the chip 13 outside the other long side 12A2 of the chip 12.

In this construction also, an identical effect of that of the aforesaid first embodiment is obtained.

The offset amounts of the inner parts of the leads 22A and the leads 22B can be made small, so the productivity of the semiconductor device can be increased.

(Embodiment 8)

Figure 21:
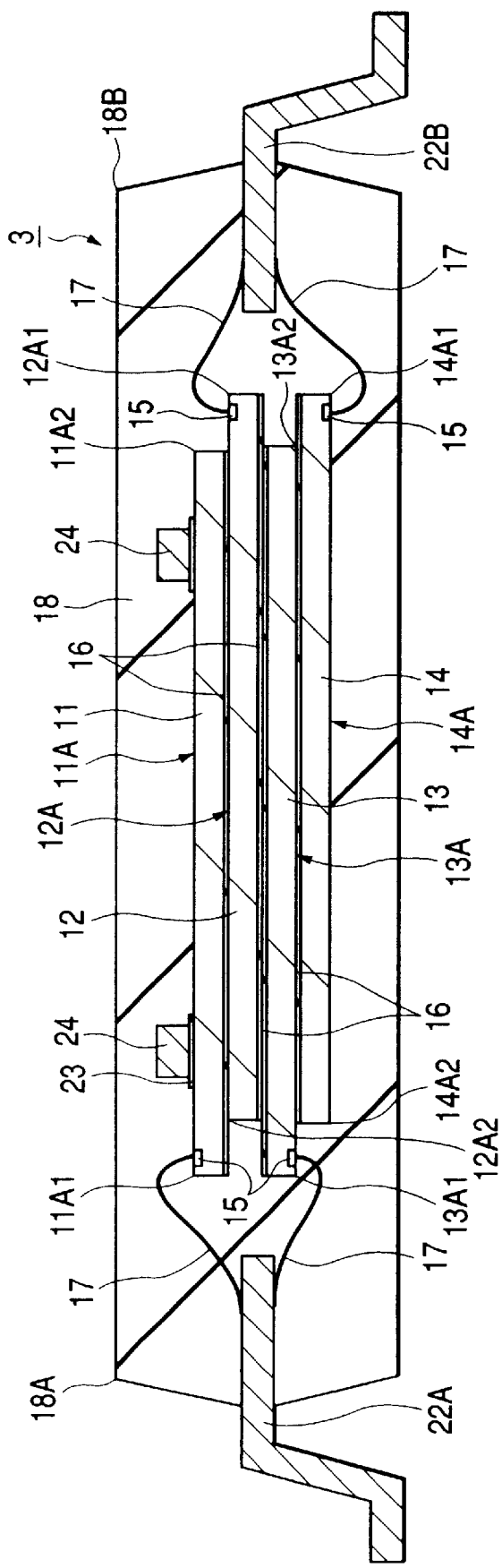
FIG. 21 is a schematic cross-sectional view of a semiconductor device according to an eighth embodiment of this invention.

FIG. 21 is a schematic plan view showing the semiconductor device according to an eighth embodiment of the invention with the upper part of the resin sealing body removed.

As shown in FIG. 21, a semiconductor device 3 according to this embodiment differs from the aforesaid first embodiment in the way the chips are laminated.

The rear surface of the chip 11 and the circuit-forming surface 12A of the chip 12 are aligned so that the long side 11A1 of the chip 11 is situated on the side of the leads 22A, and the long side 12A1 of the chip 12 is situated on the side of the leads 22B. The chip 11 and chip 12 are adhesion-fixed in positions offset with respect to one another so that the long side 11A1 of the chip 11 is situated further outside than the other long side 12A2 of the chip 12, and the electrodes 15 of the chip 12 are situated further outside than the other long side 11A2 of the chip 11.

The chip 12 and the chip 13 are adhesion-fixed with the rear surface of the chip 12 and rear surface of the chip 12 aligned so that the long side 13A1 of the chip 13 is situated on the side of the leads 22A.

The circuit-forming surface 13A of the chip 13 and rear surface of the chip 14 are aligned so that the long side 14A1 of the chip 14 is situated on the side of the leads 22 B. The chip 13 and chip 14 are adhesion-fixed in positions offset with respect to one another so that the electrodes 15 of the chip 13 are situated further outside than the other long side 14A2 of the chip 14.

The two supporting leads 24 are adhesion-fixed to the circuit-forming surface 11A of the chip 11. The electrodes 15 of the chip 11 and chip 13 are electrically connected to the leads 22A via the bonding wires 17, and the electrodes 15 of the chip 12 and chip 14 are electrically connected to the leads 22B via the bonding wires 17.

Next, the semiconductor device 3 will be described referring to FIG. 22 to FIG. 25 (schematic cross-sectional views).

Figure 22:
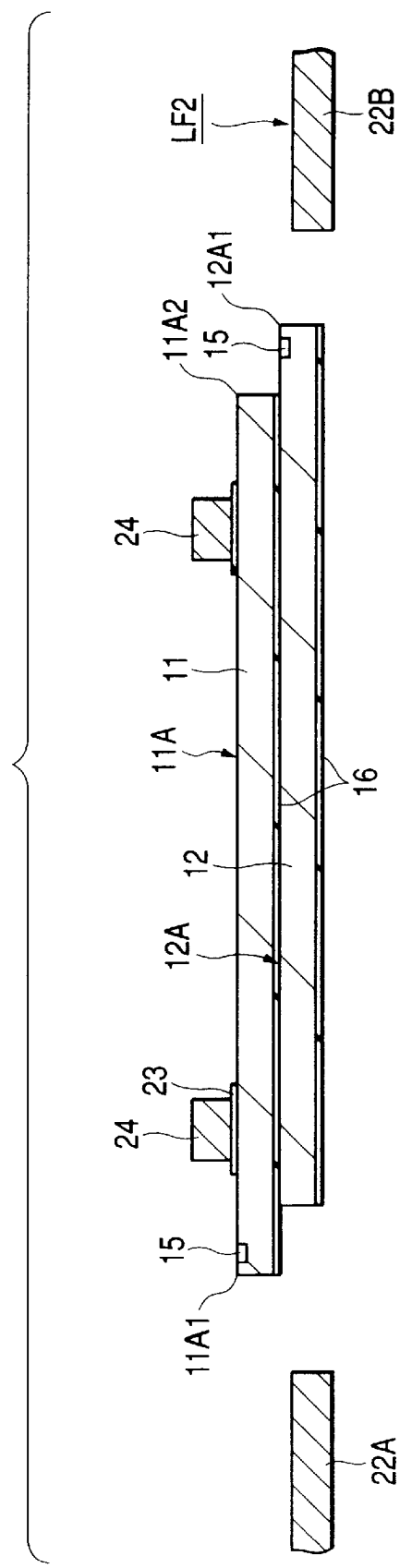
FIG. 22 is a schematic cross-sectional view describing the manufacture of the semiconductor device according to the eighth embodiment of this invention.

First, the chip 11 is adhesion-fixed to the lead frame LF2. The lead frame LF2 is fixed to the semiconductor chip 11 by fixing the supporting leads 24 to the circuit-forming surface 11A of the chip 11 via the adhesive layer 23, as shown in FIG. 22. At this time, the chip 11 is arranged so that its long side 11A1 is situated on the side of the leads 22A (one of the two mutually opposite sets of leads).

Next, the chip 12 is adhesion-fixed to the chip 11. The chip 11 is fixed to the chip 12 by fixing the circuit-forming surface 12A of the chip 12 to the rear surface of the chip 11 via the adhesive layer 16, as shown in FIG. 22. At this time, the chip 12 is arranged so that its long side 12A1 is situated on the side of the leads 22B. Also, the chip 11 and chip 12 are offset with respect one another so that the electrodes 15 of the chip 12 are situated further outside than the other long side 11A2 of the chip 11, and the long side 11A1 of the chip 11 is situated further outside than the other long side 12A2 of the chip 12.

Figure 23:
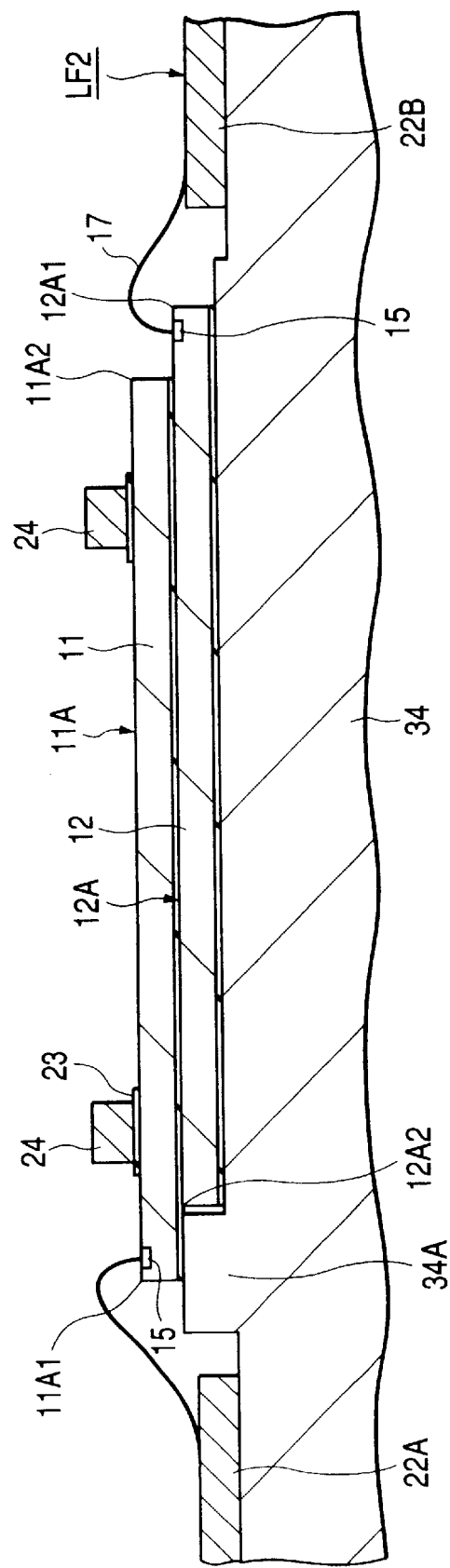
FIG. 23 is a schematic cross-sectional view describing the manufacture of the semiconductor device according to the eighth embodiment of this invention.

Next, the electrodes of the chip 11 and inner parts of the leads 22A are electrically connected by the bonding wires 17, and the electrodes of the chip 12 and the leads 22B are electrically connected by the bonding wires 17. These connections are made by fixing the lead frame LF2 to a heat stage 34 with the circuit-forming surface 11A of the chip 11 facing upwards, as shown in FIG. 23. In this step, the long side 11A1 of the chip 11 is situated further outside than the other long side 12A2 of the chip 12, so by providing a projection 34A on the heat stage 34 so that it comes in contact with the rear surface region on the side of the long side 11A1 of the chip 11, the heat stage 34 can be directly or indirectly brought into contact with the rear surface region on the side of the long side 11A1 of the chip 11.

Figure 24:
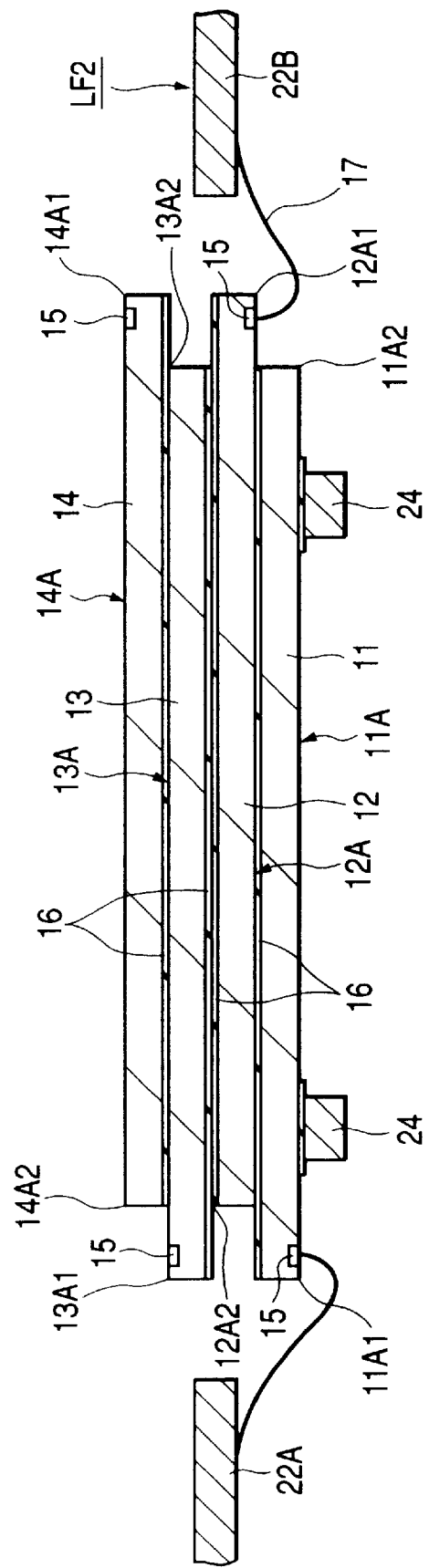
FIG. 24 is a schematic cross-sectional view describing the manufacture of the semiconductor device according to the eighth embodiment of this invention.

Next, the chip 13 is adhesion-fixed to the chip 12. The chip 12 is fixed to the chip 13 by fixing the rear surface of the chip 13 to the rear surface of the chip 12 via the adhesive layer 16, as shown in FIG. 24. At this time, the chip 13 is arranged so that its long side 13A1 is situated on the side of the leads 22A. Also, the chip 12 and chip 13 are offset with respect to one another so that the long side 13A1 of the chip 13 is situated further outside than the other long side of the chip 12.

Next, the chip 14 is adhesion-fixed to the chip 13. The chip 13 is fixed to the chip 14 by fixing the rear surface of the chip 14 to the circuit-forming surface 13A of the chip 13 via the adhesive layer 16, as shown in FIG. 24. At this time, the chip 14 is arranged so that its long side 14A1 is situated on the side of the leads 22B. Also, the chip 13 and chip 14 are offset with respect one another so that the electrodes 15 of the chip 13 are situated further outside than the other long side 14A2 of the chip 14.

Figure 25:
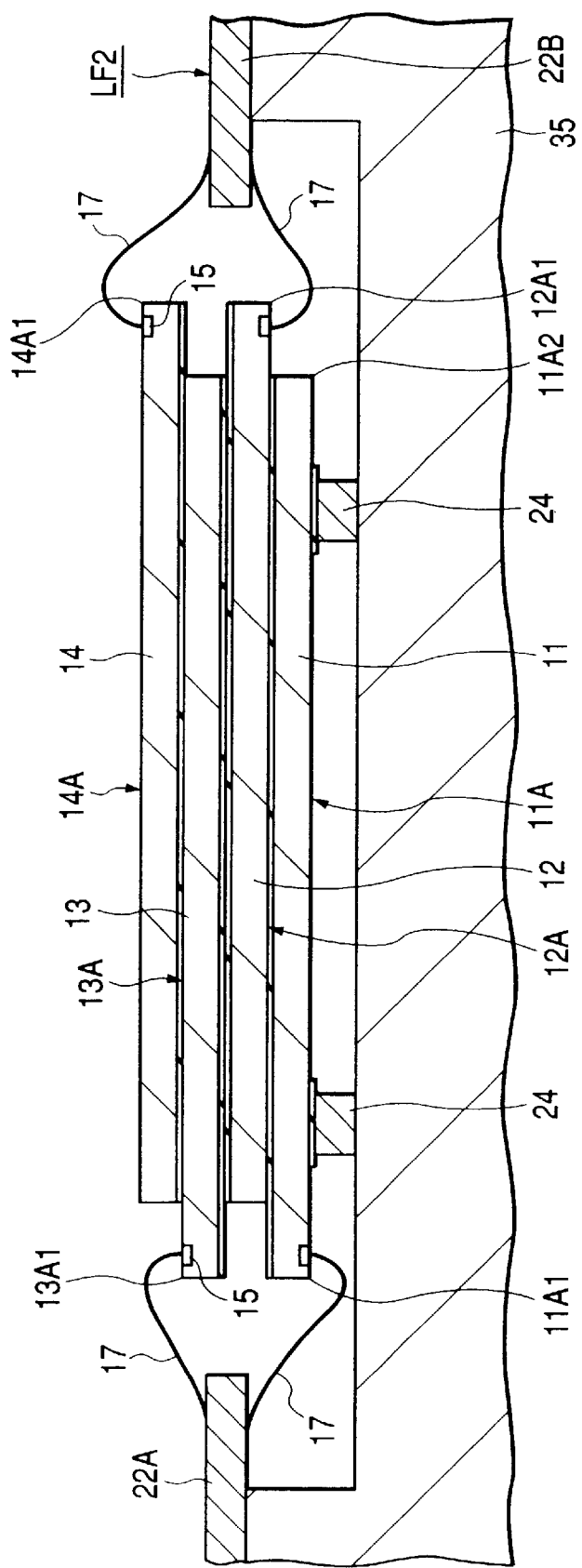
FIG. 25 is a schematic cross-sectional view describing the manufacture of the semiconductor device according to the eighth embodiment of this invention.

Next, the electrodes of the chip 13 are electrically connected to the inner parts of the leads 22A via the bonding wires 17, and the electrodes of the chip 14 are electrically connected to the leads 22B via the bonding wires 17. These connections are made by fixing the lead frame LF2 to the heat stage 35 with the circuit-forming surface 14A of the chip 14 facing upwards, as shown in FIG. 25.

Subsequently, by performing identical manufacturing steps to those of the aforesaid first embodiment, the semiconductor device 3 shown in FIG. 21 is effectively finished.

In this embodiment also, an identical effect is obtained to that of the aforesaid first embodiment.

(Embodiment 9)

Figure 26:
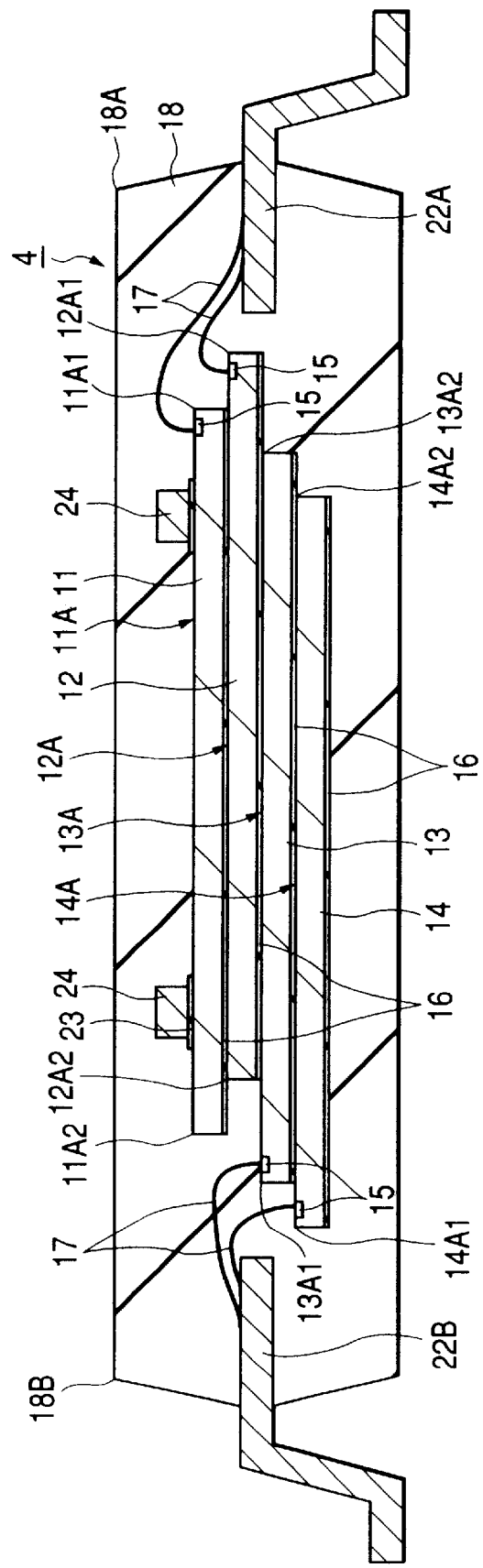
FIG. 26 is a schematic cross-sectional view describing the manufacture of the semiconductor device according to a ninth embodiment of this invention.

FIG. 26 is a schematic cross-sectional view of the semiconductor device according to a ninth embodiment of this invention.

In FIG. 26, a semiconductor device 4 according to this embodiment differs from the aforesaid first embodiment in the way the chips are laminated.

The rear surface of the chip 11 and the circuit-forming surface 12A of the chip 12 are aligned so that the long side 11A1 of the chip 11 and the long side 12A1 of the chip 12 are situated on the side of the leads 22A. The chip 11 and chip 12 are adhesion-fixed in positions offset with respect to one another so that the electrodes 15 of the chip 12 are situated further outside than the long side 11A1 of the chip 11.

The rear surface of the chip 12 and the circuit-forming surface of the chip 13 are aligned so that the long side 13A1 of the chip 13 is situated on the side of the leads 22B. The chip 12 and chip 13 are adhesion-fixed in positions offset with respect to one another so that the electrodes of the chip 13 are situated further outside than the other long side 11A2 of the chip 11.

The rear surface of the chip 13 and the circuit-forming surface 14A of the chip 14 are aligned so that the chip 14 is situated on the side of the leads 22B. The chip 13 and chip 14 are adhesion-fixed in positions offset with respect to one another so that the electrodes 15 of the chip 14 are situated further outside than the long side 13A1 of the chip 13.

The two supporting leads 24 are adhesion-fixed to the circuit-forming surface 11A of the chip 11. The electrodes 15 of the chip 11 and chip 12 are electrically connected to the leads 22A via the bonding wires 17, and the electrodes 15 of the chip 13 and chip 14 are electrically connected to the leads 22B via the bonding wires 17.

Figure 27:
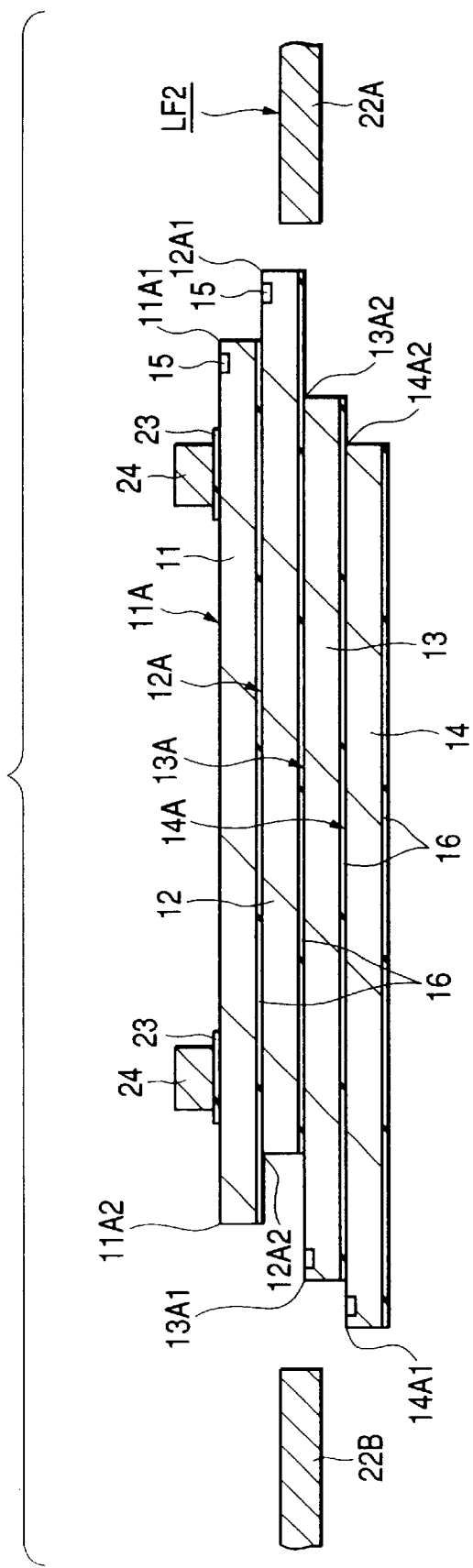
FIG. 27 is a schematic cross-sectional view describing the manufacture of the semiconductor device according to the ninth embodiment of this invention.
Figure 28:
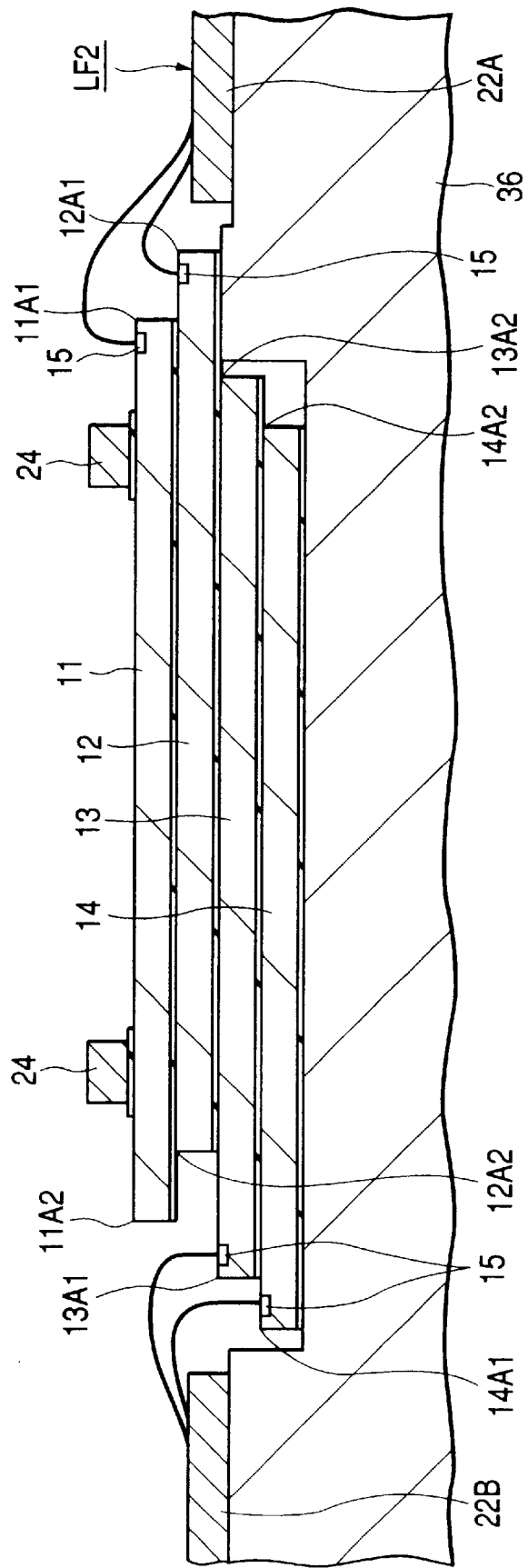
FIG. 28 is a schematic cross-sectional view describing the manufacture of the semiconductor device according to the ninth embodiment of this invention.

Next, the manufacture of the semiconductor device 4 will be described referring to FIG. 27 to FIG. 28 (schematic cross-sectional views).

First, the chip 11 is adhesion-fixed to the lead frame LF2. The lead frame LF2 is fixed to the semiconductor chip 11 by fixing the supporting leads 24 to the circuit-forming surface 11A of the chip 11 via the adhesive layer 23, as shown in FIG. 27. At this time, the chip 11 is arranged so that its long side 11A1 is situated on the side of the leads 22A (one of the two mutually opposite sets of leads).

Next, the chip 12 is adhesion-fixed to the chip 11. The chip 11 is fixed to the chip 12 by fixing the circuit-forming surface 12A of the chip 12 to the rear surface of the chip 11 via the adhesive layer 16, as shown in FIG. 27. At this time, the chip 12 is arranged so that its long side 12A1 is situated on the side of the leads 22B. Also, the chip 11 and chip 12 are offset with respect to one another so that the electrodes 15 of the chip 12 are situated further outside than the long side 11A1 of the chip 11, and the other long side 11A2 of the chip 11 is situated further outside than the other long side 12A2 of the chip 12.

Next, the chip 13 is adhesion-fixed to the chip 12. The chip 12 and chip 13 are fixed by fixing the circuit-forming surface 13A of the chip 13 to the rear surface of the chip 12 via the adhesive layer 16, as shown in FIG. 27. At this time, the chip 13 is arranged so that its long side 13A1 is situated on the side of the leads 22B. Also, the chip 12 and chip 13 are offset with respect to one another so that the electrodes 15 of the chip 13 are situated further outside than the other long side 11A2 of the chip 11, and the long side 12A1 of the chip 12 is situated further outside than the other long side 13A2 of the chip 13.

Next, the chip 14 is adhesion-fixed to the chip 13. The chip 13 and chip 14 are fixed by fixing the circuit-forming surface 14A of the chip 14 to the rear surface of the chip 13 via the adhesive layer 16, as shown in FIG. 27. At this time, the chip 14 is arranged so that its long side 14A1 is situated on the side of the leads 22B. Also, the chip 13 and chip 14 are offset with respect to one another so that the electrodes 15 of the chip 14 are situated further outside than the long side 13A1 of the chip 13, and the other long side 13A2 of the chip 13 is situated further outside than the other long side 14A2 of the chip 14.

The electrodes 15 of the chip 11 and chip 12 are electrically connected to the inner parts of the leads 22A by the bonding wires 17, and the electrodes 15 of the chip 13 and the chip 14 are electrically connected to the leads 22B by the bonding wires 17. These connections are made by fixing the lead frame LF2 to a heat stage 36 with the circuit-forming surface 11A of the chip 11 facing upwards, as shown in FIG. 28. In this step, the long side 12A1 of the chip 12 is situated further outside than the other long side 13A2 of the chip 13 and the other long side 14A2 of the chip 14, so by providing a projection 36A on the heat stage 36 so that it comes in contact with the rear surface region on the side of the long side 12A1 of the chip 12, the heat stage 36 can be directly or indirectly brought into contact with the rear surface region on the side of the long side 12A1 of the chip 12.

Subsequently, by performing identical manufacturing steps to those of the aforesaid first embodiment, the semiconductor device 4 shown in FIG. 26 is effectively finished.

In this embodiment also, an identical effect is obtained to that of the aforesaid first embodiment.

The loop height of the bonding wires 17 connected to the electrodes 15 of the chip 13 and the loop height of the bonding wires 17 connected to the electrodes 15 of the chip 14 are absorbed by the thickness of the chip 11 and chip 12, so the semiconductor device can be made thinner.

(Embodiment 10)

Figure 29:
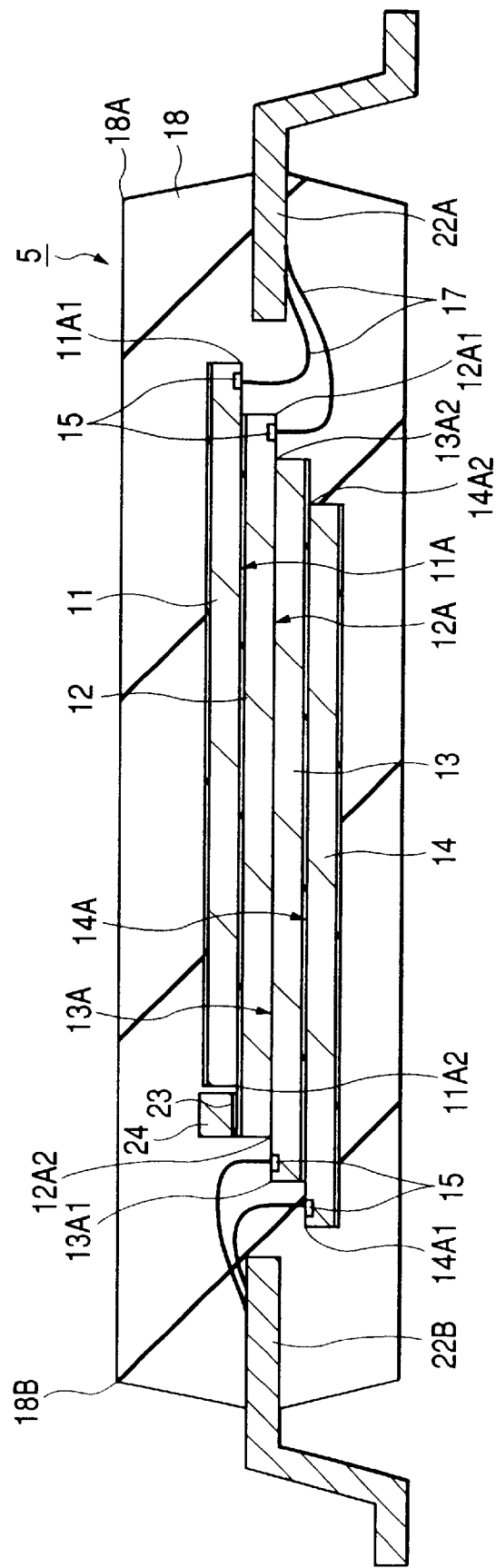
FIG. 29 is a schematic cross-sectional view of a semiconductor device according to a tenth embodiment of this invention.

FIG. 29 is a schematic cross-sectional view of the semiconductor device according to a tenth embodiment of this invention.

In FIG. 29, a semiconductor device 5 according to this embodiment differs from the aforesaid first embodiment in the way the chips are laminated.

The circuit-forming surface 11A of the chip 11 and the rear surface of the chip 12 are aligned so that the long side 11A1 of the chip 11 and the long side 12A1 of the chip 12 are situated on the side of the leads 22A. The chip 11 and chip 12 are adhesion-fixed in positions offset with respect to one another so that the electrodes 15 of the chip 11 are situated further outside than the long side 12A1 of the chip 12, and the other long side 12A2 of the chip 12 is situated further outside than the other long side 11A2 of the chip 11.

The circuit-forming surface 12A of the chip 12 and the circuit-forming surface 13A of the chip 13 are aligned so that the long side 13A1 of the chip 13 is situated on the side of the leads 22B. The chip 12 and chip 13 are adhesion-fixed in positions offset with respect to one another so that the electrodes 15 of the chip 12 are situated further outside than the other long side 13A2 of the chip 13, and the electrodes 15 of the chip 13 are situated further outside than the other long side 12A2 of the chip 12.

The rear surface of the chip 13 and the circuit-forming surface 14A of the chip 14 are aligned so that the long side 14A1 of the chip 14 is situated on the side of the leads 22B. The chip 13 and chip 14 are adhesion-fixed in positions offset with respect to one another so that the electrodes 15 of the chip 14 are situated further outside than the long side 14A1 of the chip 13.

The supporting leads 24 are adhesion-fixed to the rear surface of the chip 12 via the adhesive layer (16, 23) outside the other long side 11A2 of the chip 11. The electrodes 15 of the chip 11 and chip 12 are electrically connected to the leads 22A via the bonding wires 17, and the electrodes 15 of the chip 13 and chip 14 are electrically connected to the leads 22B via the bonding wires 17.

Due to this construction, the loop height of the bonding wires 17 is absorbed by the thickness of the semiconductor chip, so the semiconductor device 29 can be made thinner.

The invention conceived by the inventors has been described specifically based on the aforesaid embodiments, but the invention is not limited to these embodiments, it being understood that various modifications may be made within the scope and spirit of the appended claims.

What is claimed is:

1. A semiconductor device comprising:
   resin sealing body;
   plural semiconductor chips situated inside said resin sealing body and formed of rectangular-shaped plane surfaces, mutually opposite ones of said chips having a circuit forming surface and a rear surface facing each other, and said chips having electrodes disposed on the circuit forming surface, the circuit forming surface having one side and an other side opposite thereto, the electrodes being arranged along the one side of the circuit forming surface; and
   leads having inner parts situated inside the resin sealing body and outer parts situated outside the resin sealing body, the inner parts being electrically connected to the electrodes of the plural semiconductor chips via bonding wires, wherein:
      the circuit forming surfaces are aligned in the same direction with their respective one sides situated on the same side, and said plural semiconductor chips are laminated in positions offset with respect to one another such that the electrodes of one of the mutually opposite semiconductor chips are situated further outside than the one side of the other of the mutually opposite semiconductor chips.

2. A semiconductor device as defined in claim 1, wherein: said plural semiconductor chips are laminated in positions offset with respect to one another such that the other side of one of the mutually opposite semiconductor chips is situated further inside than the other side of the other semiconductor chip.

3. A semiconductor device comprising:
   a resin sealing body having a rectangular plane surface;
   first and second semiconductor chips situated inside said resin sealing body and formed of rectangular-shaped plane surfaces, having a circuit forming surface and a rear surface respectively facing each other, and having electrodes disposed on the circuit forming surface, the circuit forming surface having one side and an other side opposite thereto, the electrodes being arranged along the one side of the circuit forming surface;
   first leads having inner parts situated inside the resin sealing body, and outer parts projecting from a first side of mutually opposite first and second sides of the resin sealing body situated outside the resin sealing body, the inner parts being electrically connected to the electrodes of the first semiconductor chip via bonding wires; and
   second leads having inner parts situated inside the resin sealing body, and outer parts projecting from the second side of the resin sealing body situated outside the resin sealing body, the inner parts being electrically connected to the electrodes of the second semiconductor chip via bonding wires,
   wherein:
      the rear surface of said first semiconductor chip and the circuit forming surface of said second semiconductor chip are aligned facing each other with their respective one sides situated on the side of the second leads, the first and second semiconductor chips are adhesion-fixed in positions offset with respect to one another such that the electrodes of the second semiconductor chip are situated further outside than the one side of the first semiconductor chip, and the other side of the first semiconductor chip is situated further outside than the other side of the second semiconductor chip, and
      the inner parts of the first leads are adhesion-fixed to the circuit forming surface of said first semiconductor chip.

4. A semiconductor device comprising:
   a resin sealing body having a rectangular plane surface;
   first to fourth semiconductor chips situated inside said resin sealing body and formed of rectangular-shaped plane surfaces, having a circuit forming surface and a rear surface facing each other, and having electrodes disposed on the circuit forming surface, the circuit forming surface having one side and an other side opposite thereto, the electrodes being arranged along the one side of the circuit forming surface;
   first leads having inner parts situated inside the resin sealing body, and outer parts projecting from the first side of mutually opposite first and second sides of the resin sealing body situated outside the resin sealing body, the inner parts being electrically connected to the electrodes of the first semiconductor chip via bonding wires; and
   second leads having inner parts situated inside the resin sealing body, and outer parts projecting from the second side of the resin sealing body situated outside the resin sealing body, the inner parts being electrically connected to the electrodes of the second semiconductor chip via bonding wires,
   wherein:
      the rear surface of said first semiconductor chip and the circuit forming surface of said second semiconductor chip are aligned facing each other with their respective one sides situated on the side of the second leads, the first and second semiconductor chips are adhesion-fixed in positions offset with respect to one another such that the electrodes of the second semiconductor chip are situated further outside than the one side of the first semiconductor chip, and the other side of the first semiconductor chip is situated further outside than the other side of the second semiconductor chip, the rear surface of the second semiconductor chip and the circuit forming surface of the third semiconductor chip are aligned facing each other with their respective one sides situated on the side of the second leads, the second and third semiconductor chips are adhesion-fixed in positions offset with respect to one another such that the electrodes of the third semiconductor chip are situated further outside than the one side of the second semiconductor chip, and the other side of the second semiconductor chip is situated further outside than the other side of the third semiconductor chip, the rear surface of the third semiconductor chip and the circuit forming surface of the fourth semiconductor chip are aligned facing each other with their respective one sides situated on the side of the second leads, the third and fourth semiconductor chips are adhesion-fixed in positions offset with respect to one another such that the electrodes of the fourth semiconductor chip are situated further outside than the one side of the third semiconductor chip, and the other side of the third semiconductor chip is situated further outside than the other side of the fourth semiconductor chip, and the inner parts of the first leads are adhesion-fixed to the circuit forming surface of the first semiconductor chip.

5. A semiconductor device as defined in claim 4, wherein:

the ends of the inner parts of the first leads are disposed in the vicinity of the electrodes of the first semiconductor chip.

* * * * *